(12) United States Patent
Lee et al.

(10) Patent No.: US 11,600,567 B2
(45) Date of Patent: Mar. 7, 2023

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Chih-Cheng Lee, Kaohsiung (TW); Kuang Hsiung Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/528,352

(22) Filed: Jul. 31, 2019

(65) Prior Publication Data

US 2021/0035908 A1 Feb. 4, 2021

(51) Int. Cl.
H01L 23/528 (2006.01)
H01L 23/00 (2006.01)
H01L 23/31 (2006.01)
H01L 21/56 (2006.01)
H01L 21/768 (2006.01)

(52) U.S. Cl.
CPC ......... H01L 23/5283 (2013.01); H01L 21/56 (2013.01); H01L 21/76871 (2013.01); H01L 21/76877 (2013.01); H01L 23/3107 (2013.01); H01L 24/09 (2013.01); H01L 24/17 (2013.01); H01L 24/25 (2013.01); H01L 24/49 (2013.01); H01L 2224/02371 (2013.01)

(58) Field of Classification Search
CPC ............... H01L 24/25; H01L 24/49; H01L 2224/02371; H01L 27/00; H01L 21/76871; H01L 21/76877; H01L 21/56
See application file for complete search history.

(56) References Cited

U.S. PATENT DOCUMENTS

| | | | | |
|---|---|---|---|---|
| 11,018,080 | B2* | 5/2021 | Weerasekera | H01L 21/4857 |
| 2006/0226527 | A1* | 10/2006 | Hatano | H01L 24/05 257/686 |
| 2011/0240357 | A1* | 10/2011 | Kariya | H05K 3/4644 174/266 |
| 2012/0104562 | A1* | 5/2012 | Pagaila | H01L 24/18 257/621 |
| 2014/0239438 | A1* | 8/2014 | Kilger | H01L 24/24 257/528 |
| 2017/0084596 | A1* | 3/2017 | Scanlan | H01L 25/50 |
| 2017/0243803 | A1* | 8/2017 | Lin | H01L 21/4807 |
| 2018/0040548 | A1* | 2/2018 | Kim | H01L 21/4857 |
| 2018/0211929 | A1* | 7/2018 | Bae | H01L 24/20 |
| 2019/0043792 | A1* | 2/2019 | Weerasekera | H01L 21/4857 |

(Continued)

*Primary Examiner* — Monica D Harrison
*Assistant Examiner* — Lawrence C Tynes, Jr.
(74) *Attorney, Agent, or Firm* — Foley & Lardner LLP

(57) ABSTRACT

A semiconductor device package includes a first circuit layer, a second circuit layer, a first semiconductor die and a second semiconductor die. The first circuit layer includes a first surface and a second surface opposite to the first surface. The second circuit layer is disposed on the first surface of the first circuit layer. The first semiconductor die is disposed on the first circuit layer and the second circuit layer, and electrically connected to the first circuit layer and the second circuit layer. The second semiconductor die is disposed on the second circuit layer, and electrically connected to the second circuit layer.

13 Claims, 31 Drawing Sheets

(56) References Cited

U.S. PATENT DOCUMENTS

| | | | |
|---|---|---|---|
| 2019/0148304 A1* | 5/2019 | Gavagnin | H01L 22/20 257/773 |
| 2020/0075546 A1* | 3/2020 | Shih | H01L 23/3128 |
| 2020/0105663 A1* | 4/2020 | Tsai | H01L 23/5226 |
| 2020/0328151 A1* | 10/2020 | Sir | H01L 25/18 |
| 2020/0395300 A1* | 12/2020 | Xie | H01L 25/0655 |

* cited by examiner

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor device package using a low-density interconnection structure and a high-density interconnection structure to respectively electrically connecting low-density input/output (I/O) terminals and high-density I/O terminals between two or more semiconductor dies, and a method for manufacturing the same.

2. Description of the Related Art

Semiconductor dies of a semiconductor device package are to be in communication with each other to achieve desired electrical functionality. In a comparative semiconductor device package, a redistribution layer (RDL) is used as a communication bridge between the semiconductor dies. Some advanced semiconductor dies have high-density input/output (I/O) terminals and low-density I/O terminals at the same time, and thus specify a multi-layered RDL to redistribute signals from both high-density input/output (I/O) terminals and low-density I/O terminals of the semiconductor dies. The yield of the RDL, however, decreases as the layers of the RDL increases. Thus, the comparative semiconductor device package suffers from low yield when the layers of the RDL increase.

SUMMARY

In some embodiments, a semiconductor device package includes a first circuit layer, a second circuit layer, a first semiconductor die and a second semiconductor die. The first circuit layer includes a first surface and a second surface opposite to the first surface. The second circuit layer is disposed on the first surface of the first circuit layer. The first semiconductor die is disposed on the first circuit layer and the second circuit layer, and electrically connected to the first circuit layer and the second circuit layer. The second semiconductor die is disposed on the second circuit layer, and electrically connected to the second circuit layer.

In some embodiments, a method for manufacturing a semiconductor device package includes following steps. A first circuit layer is formed on a carrier. A second circuit layer is disposed on the carrier subsequent to formation of the first circuit layer. A plurality of semiconductor dies are provide. A first group of terminals of each of the semiconductor dies is bonded to the first circuit layer, and a second group of terminals of each of the semiconductor dies is bonded to the second circuit layer.

In some embodiments, a semiconductor device package includes a first interconnection structure, a second interconnection structure, a first semiconductor die and a second semiconductor die. The first interconnection structure includes a low-density circuit layer. The second interconnection structure includes a high-density circuit layer having a density of input/output (I/O) terminals relatively higher than that of the low-density circuit layer. The first semiconductor die and the second semiconductor die each include a group of low-density I/O terminals and a group of high-density I/O terminals. The group of low-density I/O terminals of the first semiconductor die and the group of low-density I/O terminals of the second semiconductor die are bonded to the low-density circuit layer of the first interconnection structure and are in electrical communication with each other through the low-density circuit layer of the first interconnection structure. The group of high-density I/O terminals of the first semiconductor die and the group of high-density I/O terminals of the second semiconductor die are bonded to the high-density circuit layer of the second interconnection structure and are in electrical communication with each other through the high-density circuit layer of the second interconnection structure.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
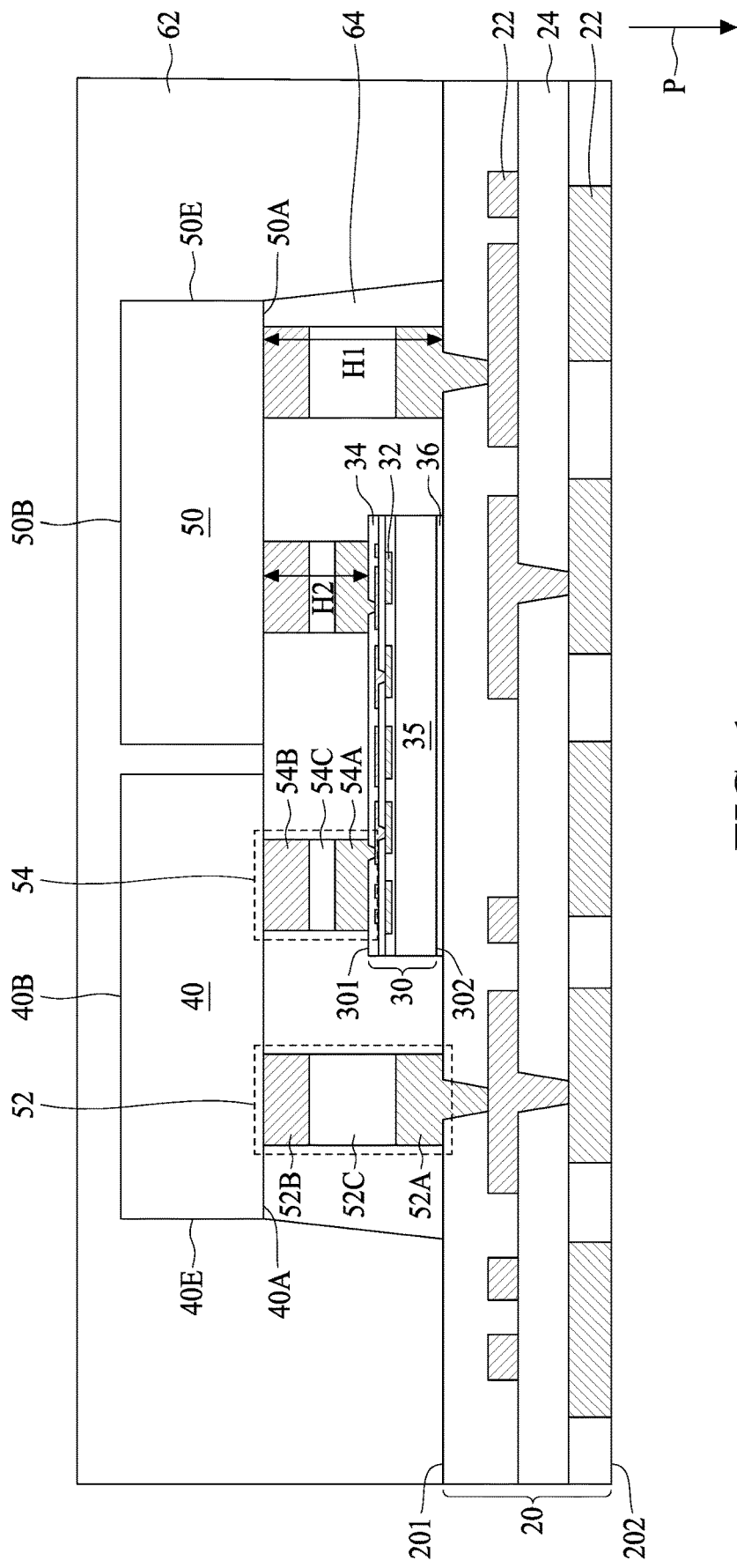
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments, the present disclosure provides a semiconductor device package and a method for manufacturing the same. The semiconductor device package includes a first interconnection structure, a second interconnection structure, a first semiconductor die and a second semiconductor die. The first interconnection structure has a low-density circuit layer, and the second interconnection structure has a high-density circuit layer. The density of input/output (I/O) terminals of the high-density circuit layer is relatively higher than that of the low-density circuit layer. The first semiconductor die and the second semiconductor die each include a group of low-density I/O terminals and a group of high-density I/O terminals. The group of low-density I/O terminals of the first semiconductor die and the second semiconductor die are bonded to the low-density circuit layer of the first interconnection structure and are in electrical communication with each other through the low-density circuit layer of the first interconnection structure, and the group of high-density I/O terminals of the first semiconductor die and the second semiconductor die are bonded to the high-density circuit layer of the second interconnection structure and are in electrical communication with each other through the high-density circuit layer of the second interconnection structure. The first interconnection structure and the second interconnection structure may not be directly electrically connected to each other.

In some embodiments, the low-density circuit layer may include a bumping-level circuit layer or a substrate-level circuit layer with a relatively wider line width/line space (L/S), and the high-density circuit layer may include a foundry-level circuit layer with a relatively narrower L/S. By way of example, the L/S of the low-density circuit layer may be between about 2 μm/about 2 and about 10 μm/about 10 μm or wider than about 10 μm/about 10 and the L/S of the high-density circuit layer may be less than about 2 μm/about 2 The bumping-level circuit layer may be patterned and defined by e.g., low-end photolithography-plating-etching techniques, and the foundry-level circuit layer may be patterned and defined by e.g., high-end photolithography-plating-etching techniques. In some other embodiments, the low-density circuit layer may include a substrate-level circuit layer with a relatively wider line width/line space (L/S), and the high-density circuit layer may include a bumping-level circuit layer or a foundry-level circuit layer with a relatively narrower L/S. By way of example, the L/S of the low-density circuit layer may be wider than about 10 μm/about 10 and the L/S of the high-density circuit layer may be between about 2 μm/about 2 μm and about 10 μm/about 10 μm or less than about 2 μm/about 2 The substrate-level circuit layer may be patterned and defined by e.g., laser drill-plating-etching techniques.

The low-density circuit layer and the high-density circuit layer can be individually formed by different processes, and thus can be respectively used to provide interconnections for low-density I/O region and high-density I/O region of the semiconductor dies. Compared to an interconnection structure including multi-layered circuit layers for providing interconnection for both low-density I/O region and high-density I/O region of the semiconductor dies, the individual high-density and low-density interconnection structures diverge the interconnections for low-density I/O region and high-density I/O region of the semiconductor dies. Accordingly, the layer(s) of the circuit layer of each of the high-density interconnection structure and the low-density interconnection structure can be reduced, and thus yield of each of the high-density interconnection structure and the low-density interconnection structure can be increased. In addition, the individual high-density and low-density interconnection structures can shorten the signal transmission path between the semiconductor dies, and thus electrical performance of the semiconductor device package can be improved.

Figure 1A:
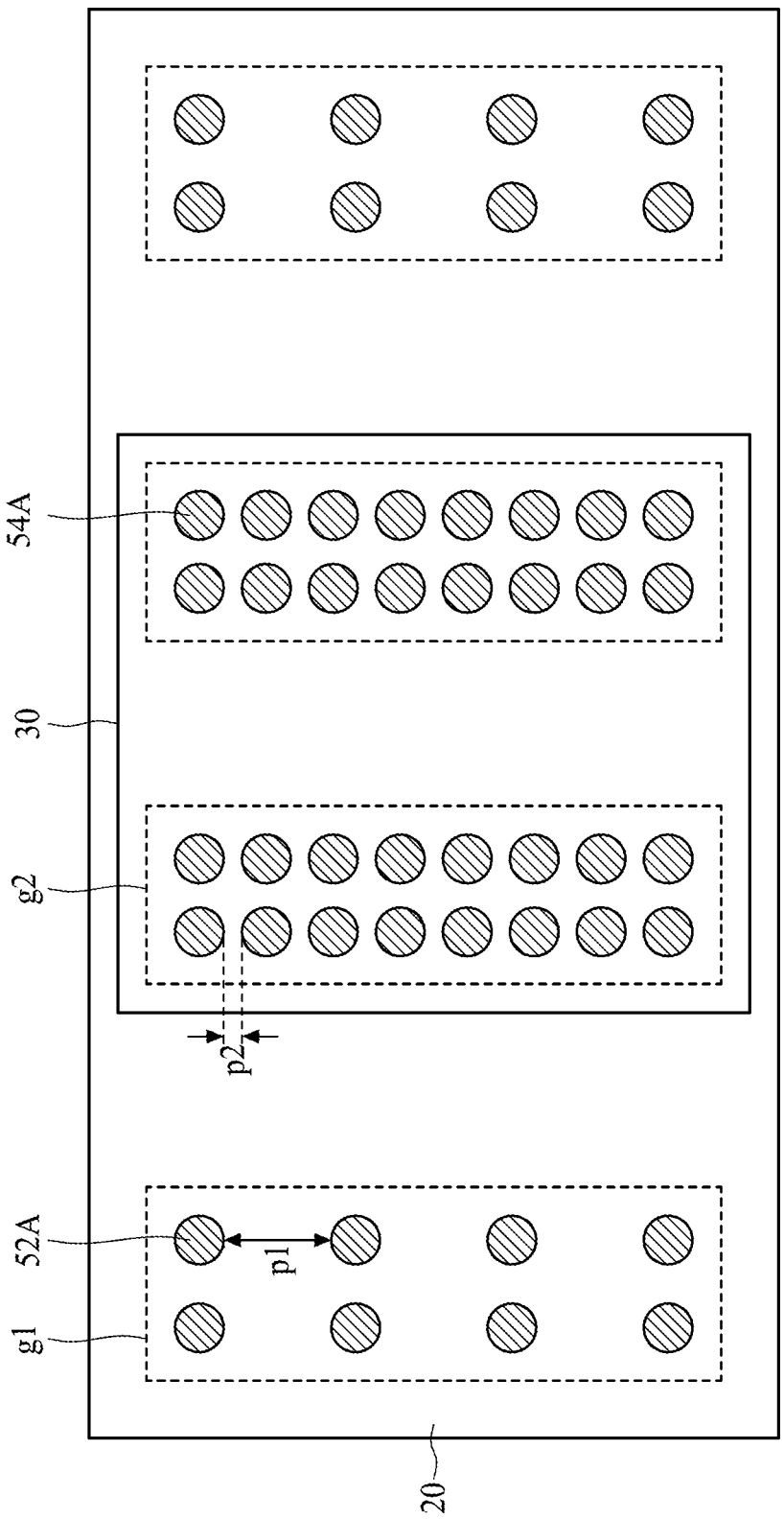
FIG. 1A is a top view of a first interconnection structure and a second interconnection structure of a semiconductor device package in FIG. 1.
Figure 1B:
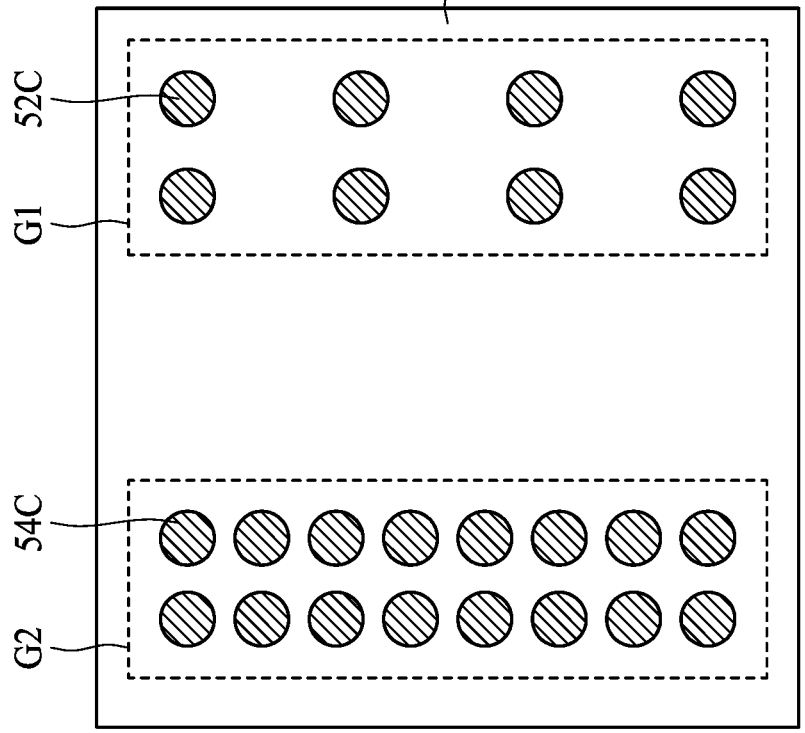
FIG. 1B is a bottom view of a first semiconductor die and a second semiconductor die of a semiconductor device package of FIG. 1.
Figure 1B:
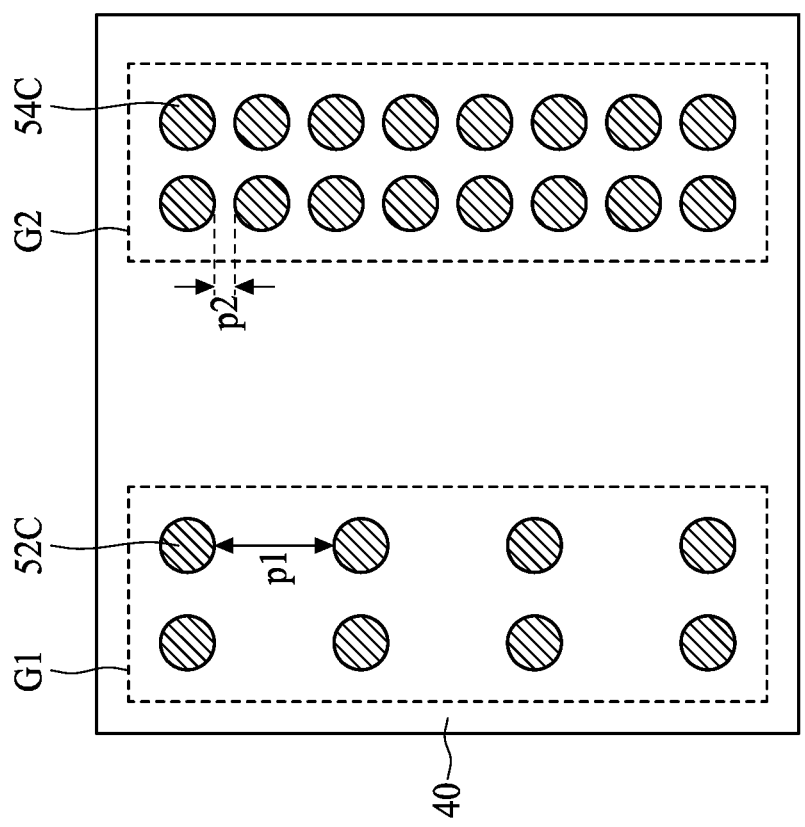

FIG. 1 is a cross-sectional view of a semiconductor device package 1 in accordance with some embodiments of the present disclosure, FIG. 1A is a top view of a first interconnection structure and a second interconnection structure of a semiconductor device package 1 in FIG. 1, and FIG. 1B is a bottom view of a first semiconductor die and a second semiconductor die of a semiconductor device package 1 of FIG. 1. As shown in FIG. 1, FIG. 1A and FIG. 1B, the semiconductor device package 1 includes a first interconnection structure 20, a second interconnection structure 30, a first semiconductor die 40 and a second semiconductor die 50. The first interconnection structure 20 may include a first circuit layer including a first surface (e.g., a top surface) 201 and a second surface (e.g., a bottom surface) 202 opposite to the first surface 201. In some embodiments, the first circuit layer may include a redistribution layer (RDL). The first circuit layer may include one or more first conductive wirings 22 and one or more dielectric layers 24 stacked on one another. The material of the first conductive wirings 22 may include metal such as copper. The material of the dielectric layers 24 may include organic or inorganic dielectric material, and the dielectric layers 24 may include the same or different dielectric materials. The second interconnection structure 30 may include a second circuit layer including a third surface (e.g., a top surface) 301 and a fourth surface (e.g., a bottom surface) 302 opposite to the third surface 301. The second circuit layer may be disposed on, adjacent to, or embedded in and exposed by the first surface 201 of the first interconnection structure 20. By way of example, the fourth surface 302 of the second circuit layer is substantially leveled with or higher than the first surface 201 of the first circuit layer. In some embodiments, the second circuit layer may include a bridge die. The second circuit layer may include one or more second conductive wirings 32 and one or more dielectric layers 34 stacked on one another. The material of the second conductive wirings 32 may include metal such as copper. The material of the dielectric layers 34 may include organic or inorganic dielectric material, and the dielectric layers 34 may include the same or different dielectric materials. In some embodiments, the semiconductor device package 1 may further include a base 35 disposed between the first circuit layer and the second circuit layer. For example, the base 35 may include a semiconductor base or a glass base configured to support the conductive wiring 32 and the dielectric layer 34. In some embodiments, the second circuit layer may be attached to the first surface 201 of the first circuit layer by an adhesive layer 36 such as a die attaching film (DAF). The first interconnection structure 20 and the second interconnection structure 30 are respectively configured to provide electrical interconnection between the first semiconductor die 40 and the second semiconductor die 50, and the first interconnection structure 20 and the second interconnection structure 30 may not be in direct communication with each other.

The first semiconductor die 40 and the second semiconductor die 50 may individually include an active die such as SOC die, memory die, MEMS die or the like. The first semiconductor die 40 and the second semiconductor die 50 each may include one or more conductive wirings embedded therein. In some embodiments, the first semiconductor die 40 is disposed on and electrically connected to the first interconnection structure 20 and the second interconnection structure 30, and the second semiconductor die 50 is disposed on and electrically connected to the second interconnection structure 30. In some embodiments, the second semiconductor die 50 may be further disposed on and electrically connected to the first interconnection structure 20. In some embodiments, the first semiconductor die 40 and the second semiconductor die 50 may be arranged side by side, and the first semiconductor die 40 and the second semiconductor die 50 each partially overlap the second interconnection structure 30 in a vertical projection direction P perpendicular to the first surface 201 of the first interconnection structure 20.

In some embodiments, the semiconductor device package 1 may further include an encapsulation layer 62 disposed on the first surface 201 of the first interconnection structure 20 and encapsulating the first semiconductor die 40 and the second semiconductor die 50. The encapsulation layer 62 may cover edges 40E of the first semiconductor die 40 and edges 50E of the second semiconductor die 50. The encapsulation layer 62 may further cover an upper surface (passive surface) 40B of the first semiconductor die 40 and an upper surface 50B of the second semiconductor die 50. In some other embodiments, the encapsulation layer 62 may expose the upper surface 40B of the first semiconductor die 40 and the upper surface 50B of the second semiconductor die 50. In some embodiments, the semiconductor device package 1 may further include an underfill layer 64 disposed between the first semiconductor die 40 and the first interconnection structure 20/the second interconnection structure 30, between the second semiconductor die 50 and the first interconnection structure 20/the second interconnection structure 30. Alternatively, the underfill layer 64 may be omitted, and the encapsulation layer 62 may be further disposed between the first semiconductor die 40 and the first interconnection structure 20/the second interconnection structure 30, and between the second semiconductor die 50 and the first interconnection structure 20/the second interconnection structure 30.

In some embodiments, the active surface 40A of the first semiconductor die 40 and the active surface 50A of the second semiconductor die 50 each face the first interconnection structure 20 and the second interconnection structure 30. The first semiconductor die 40 and the second semiconductor die 50 each may be die-to-die bonded to both the first interconnection structure 20 and the second interconnection structure 30. The semiconductor device package 1 may further include a plurality of first conductive structures 52 and second conductive structures 54. In some embodiments, each of the first conductive structures 52 and each of the second conductive structures 54 may include a micro conductive bump. The first conductive structures 52 may be disposed between the first semiconductor die 40 and the first interconnection structure 20 and electrically connecting the first semiconductor die 40 to the first interconnection structure 20, and disposed between the second semiconductor die 50 and the first interconnection structure 20 and electrically connecting the second semiconductor die 50 to the first interconnection structure 20. The first interconnection structure 20 and the second interconnection structure 30 are not directly electrically connected to each other. The first interconnection structure 20 and the second interconnection structure 30 may be electrically connected to each other through the first conductive structures 52 and the second conductive structures 54.

In some embodiments, the first conductive structure 52 may include a bottom bonding pad (also referred to as a bottom micro conductive bump) 52A electrically connected to the first conductive wiring 22, a top bonding pad (also referred to as a top micro conductive bump) 52B electrically connected to the first semiconductor die 40 or the second semiconductor die 50, and a solder material 52C disposed between and electrically connected to the bottom boding pad 52A and the top bonding pad 52B. In some embodiments, the bottom bonding pads 52A may belong to a portion of the first conductive wiring 22 of the first interconnection structure 20, and may be configured as low-density I/O terminals of the first interconnection structure 20. The top bonding pads 52B may belong to a portion of the conductive wiring of the first semiconductor die 40 or the second semiconductor die 50, and may be configured as low-density I/O terminals of the first semiconductor die 40 or the second semiconductor die 50. The second conductive structures 54 may be disposed between the first semiconductor die 40 and the second interconnection structure 30 and electrically connecting the first semiconductor die 40 to the second interconnection structure 30, and disposed between the second semiconductor die 50 and the second interconnection structure 30 and electrically connecting the second semiconductor die 50 to the second interconnection structure 30. In some embodiments, the second conductive structures 54 may include a bottom bonding pad (also referred to as a bottom micro conductive bump) 54A electrically connected to the second conductive wiring 32, a top bonding pad (also referred to as a top micro conductive bump) 54B electrically connected to the first semiconductor die 40 or the second semiconductor die 50, and a solder material 54C disposed between and electrically connected to the bottom boding pad 54A and the top bonding pad 54B. In some embodiments, the bottom bonding pads 54A may belong to a portion of the second conductive wiring 32 of the second interconnection structure 30, and may be configured as high-density I/O terminals of the second interconnection structure 30. The top bonding pads 54B may belong to a portion of the conductive wiring of the first semiconductor die 40 or the second semiconductor die 50, and may be configured as high-density I/O terminals of the first semiconductor die 40 or the second semiconductor die 50.

In some embodiments, a height H1 of the first conductive structure 52 is larger than a height H2 of the second conductive structure 54, and a difference between the height H1 and the height H2 is substantially equal to the thickness of the second interconnection structure 30 such that the first semiconductor die 40 and the second semiconductor die 50 can be disposed horizontally with respect to the first surface 201 of the first interconnection structure 20.

As shown in FIG. 1A, the first interconnection structure 20 may include one or more groups g1 of bottom bonding pads 52A configured as low-density I/O terminals to receive the low-density I/O terminals of the first semiconductor die 40 and the second semiconductor die 50. The second interconnection structure 30 may include one or more groups g2 of bottom bonding pads 54A configured as high-density I/O terminals to receive the high-density I/O terminals of the first semiconductor die 40 and the second semiconductor die 50. The pitch p2 between two adjacent bottom bonding pads 54A is smaller than the pitch p1 between two adjacent bottom bonding pads 52A.

As shown in FIG. 1B, the first semiconductor die 40 and the second semiconductor die 50 each include one or more groups G1 of top bonding pads 52C configured as low-density I/O terminals and one or more groups G2 of top bonding pads 54C configured as high-density I/O terminals. The pitch P2 between two adjacent top bonding pads 54C is smaller than the pitch P1 between two adjacent top bonding pads 54A. The pitch P2 between two adjacent top bonding pads 54C may be substantially the same as the pitch p2 between two adjacent bottom bonding pads 54A, and the pitch P1 between two adjacent top bonding pads 52C may be substantially the same as the pitch p1 between two adjacent bottom bonding pads 52A.

The group G1 of low-density I/O terminals of the first semiconductor die 40 and the group G1 of low-density I/O terminals of the second semiconductor die 50 are bonded to the groups g1 of bottom bonding pads 52A and are in electrical communication with each other through the low-density circuit layer of the first interconnection structure 20. The group G2 of high-density I/O terminals of the first semiconductor die 40 and the second semiconductor die 50 are bonded to the groups g2 of bottom bonding pads 54A and are in electrical communication with each other through the high-density circuit layer of the second interconnection structure 30. The numbers and arrangements of the low-density I/O terminals and high-density I/O terminals can be modified.

The semiconductor device package 1 includes the first interconnection structure 20 and the second interconnection structure 30 to diverge the low-density I/O connections and the high-density I/O connections between the first semiconductor die 40 and the second semiconductor die 50. Since the high-density and low-density electrical connections between the first semiconductor die 40 and the second semiconductor die 50 are diverged, the layer numbers of the conductive wirings in each of the first semiconductor die 40 and the second semiconductor die 50 can be reduced compared to the layer numbers of the conductive wirings of an interconnection structure that deals with all electrical connections. In addition, the first semiconductor die 40 and the second semiconductor die 50 each may be die-to-die bonded to both the first interconnection structure 20 and the second interconnection structure 30, and thus the signal transmission path between the first semiconductor die 40 and the second semiconductor die 50 can be shortened.

Figure 2:
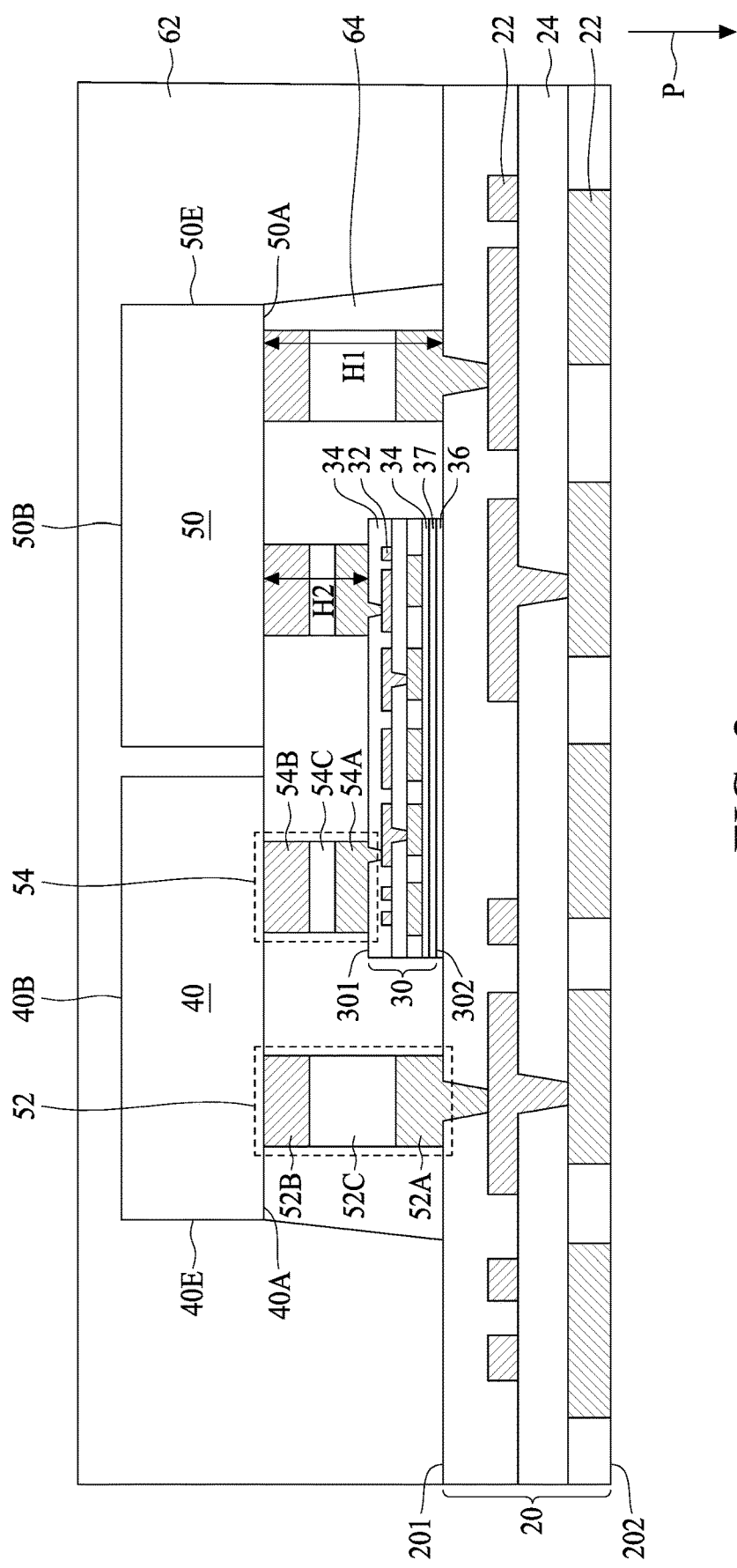
FIG. 2 is a cross-sectional view of a semiconductor device package in accordance with some embodiments of the present disclosure.

FIG. 2 is a cross-sectional view of a semiconductor device package 2 in accordance with some embodiments of the present disclosure. As shown in FIG. 2, in contrast to the semiconductor device package 1, a conductive layer 37 such as a copper foil layer is disposed between the first circuit layer and the second circuit layer. In some embodiments, the base 35 may be omitted. The conductive layer 37 may be configured to support the second circuit layer. The conductive layer 37 may also be configured as a heat dissipation layer.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 3A:
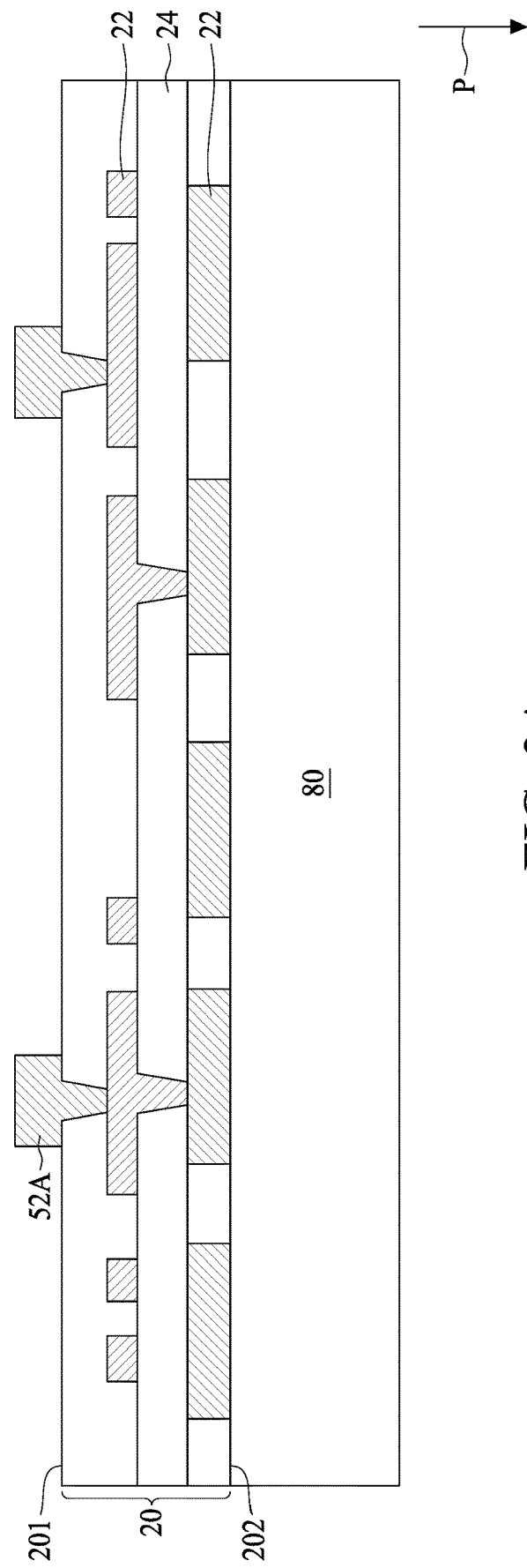
FIG. 3A, FIG. 3B, FIG. 3C and FIG. 3D illustrate operations of manufacturing a semiconductor device package in accordance with some embodiments of the present disclosure.

FIG. 3A, FIG. 3B, FIG. 3C and FIG. 3D illustrate operations of manufacturing a semiconductor device package in accordance with some embodiments of the present disclosure. As shown in FIG. 3A, a first interconnection structure 20 is formed on a carrier 80. The first interconnection structure 20 may include a first circuit layer including a first surface 201 and a second surface 202 opposite to the first surface 201. In some embodiments, the first circuit layer may include a redistribution layer (RDL including one or more first conductive wirings 22 and one or more dielectric layers 24 stacked on one another. Examples of method for forming the first interconnection structure 20 are illustrated in FIGS. 4A-4D.

Figure 3B:
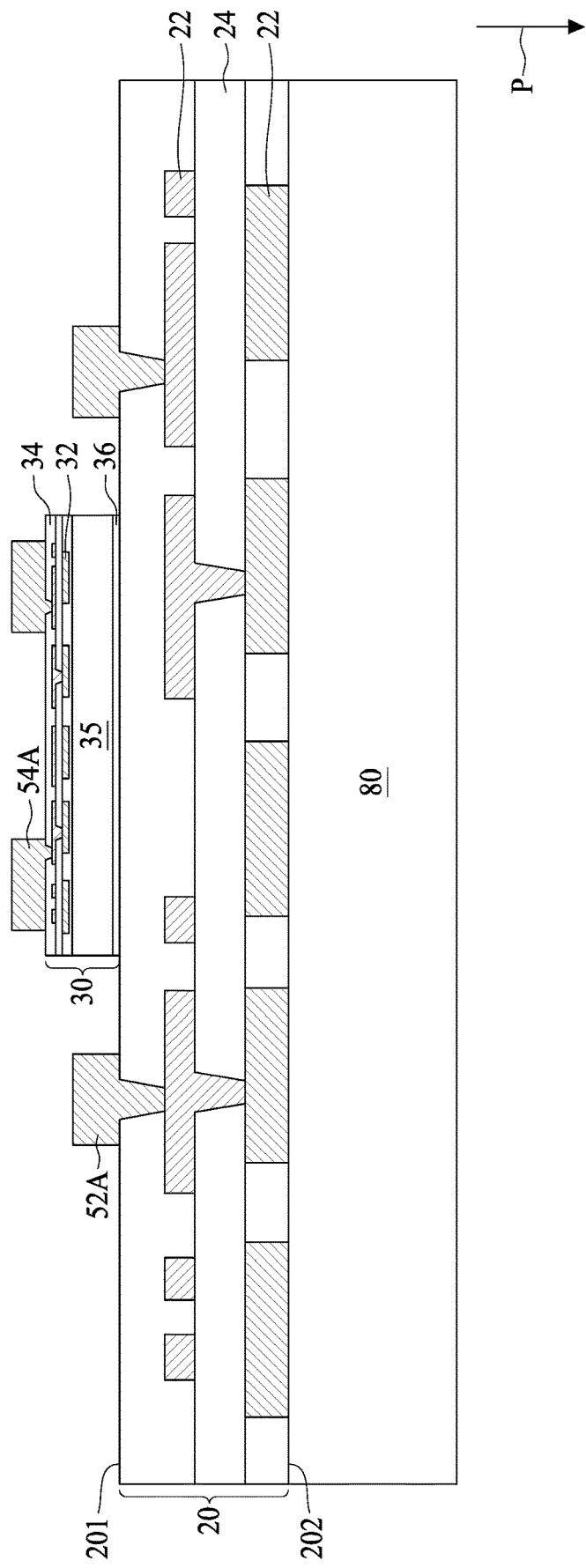

As shown in FIG. 3B, a second interconnection structure 30 is formed on the first surface 201. The second interconnection structure 30 may include a second circuit layer including a third surface 301 and a fourth surface 302 opposite to the third surface 301. In some embodiments, the second interconnection structure 30 may be formed and then disposed on the first interconnection structure 20. By way of example, the second interconnection structure 30 may be attached to the first interconnection structure 20 by an adhesive layer 36. Examples of method for forming the second interconnection structure 30 are illustrated in FIGS. 5A-5D or FIGS. 6A-6D.

Figure 3C:
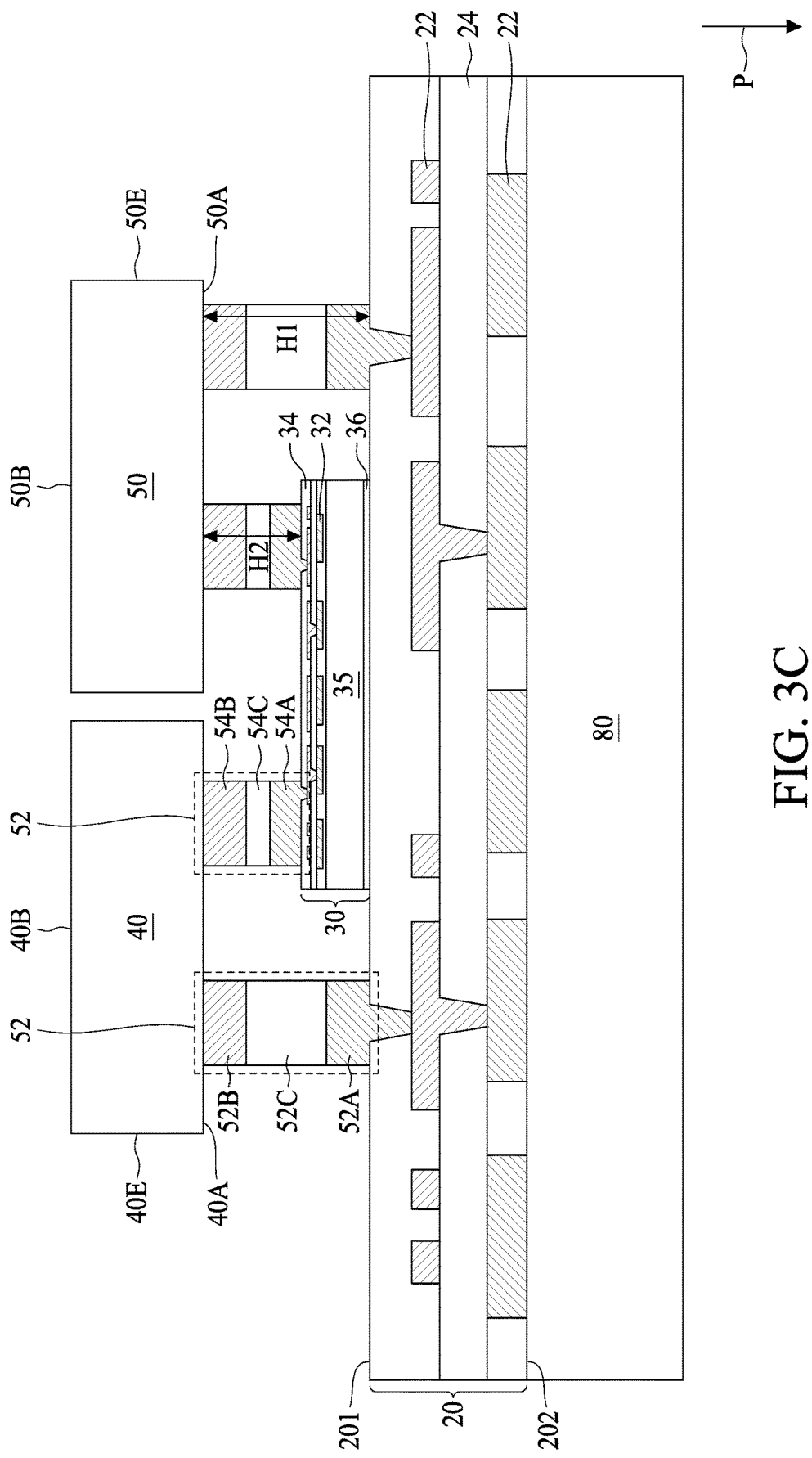

As shown in FIG. 3C, a first semiconductor die 40 and a second semiconductor die 50 are formed on the first interconnection structure 20 and the second interconnection structure 30, and both of the first semiconductor die 40 and the second semiconductor die 50 are electrically connected to the first interconnection structure 20 and the second interconnection structure 30 through first conductive structures 52 and the second conductive structures 54.

Figure 3D:
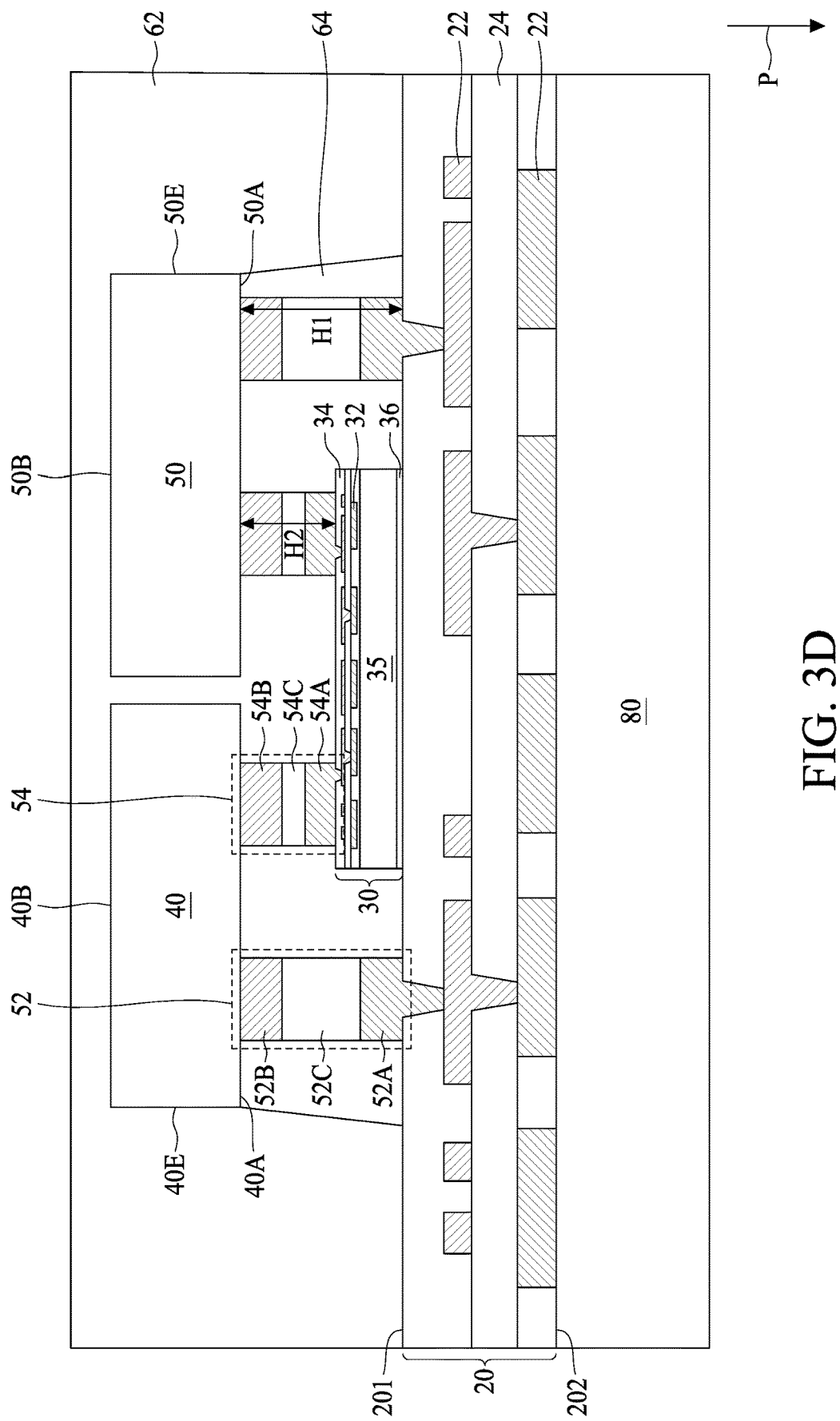

As shown in FIG. 3D, an underfill layer 64 is formed between the first semiconductor die 40 and the first interconnection structure 20/the second interconnection structure 30, between the second semiconductor die 50 and the first interconnection structure 20/the second interconnection structure 30. An encapsulation layer 62 may be formed on the first surface 201 of the first interconnection structure 20 and encapsulating the first semiconductor die 40 and the second semiconductor die 50.

Figure 4A:
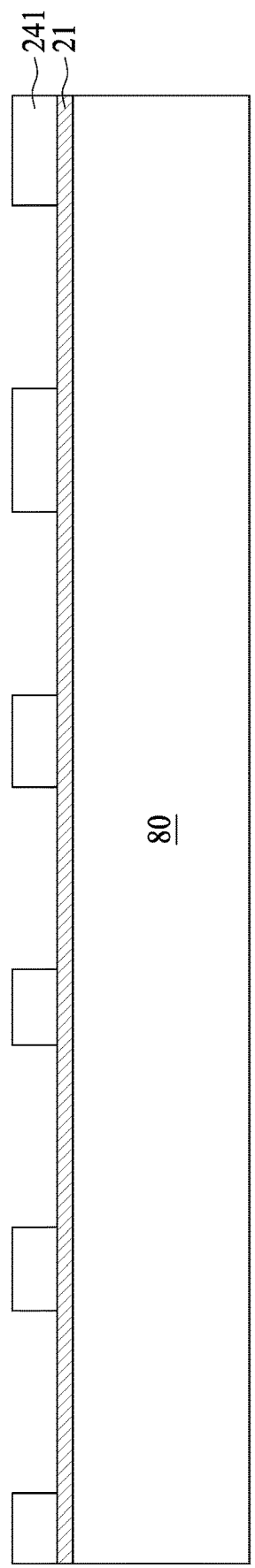
FIG. 4A, FIG. 4B, FIG. 4C and FIG. 4D illustrate operations of manufacturing a first interconnection structure of a semiconductor device package in accordance with some embodiments of the present disclosure.

FIG. 4A, FIG. 4B, FIG. 4C and FIG. 4D illustrate operations of manufacturing a first interconnection structure of a semiconductor device package in accordance with some embodiments of the present disclosure. As shown in FIG. 4A, a carrier 80 is received. A seed layer 21 is formed on the carrier 80. The seed layer 21 includes a conductive layer such as a copper layer, and the seed layer 21 can be formed by physical vapor deposition (PVD) such as sputtering. A first patterned dielectric layer 241 is formed on the seed layer 21 to partially expose the seed layer 21. In some embodiments, the first patterned dielectric layer 241 may include a photo-resistive layer, which can be patterned by photolithography.

Figure 4B:
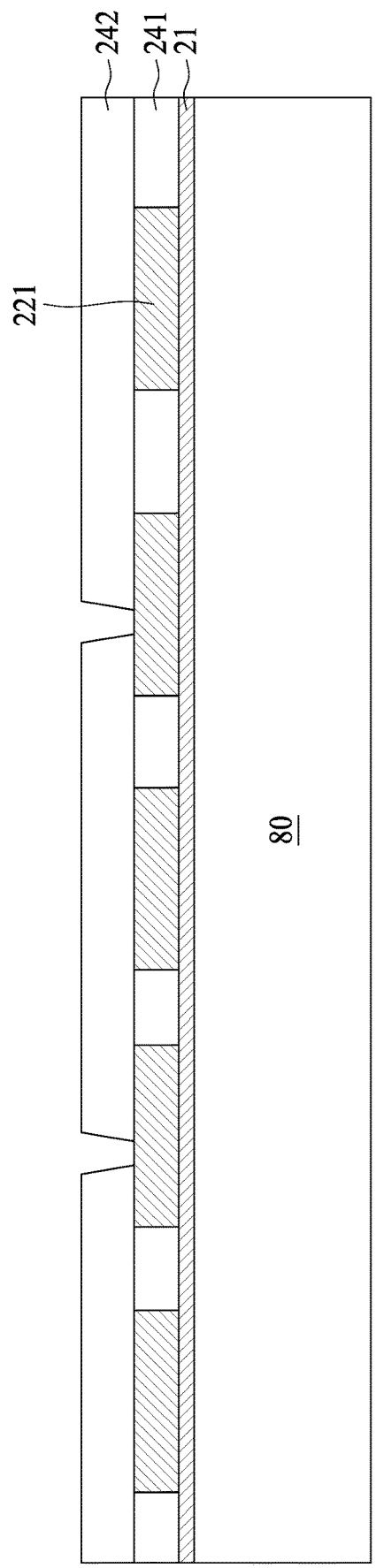

As shown in FIG. 4B, first conductive wirings 221 are formed on the seed layer 21 exposed by the first patterned dielectric layer 241. In some embodiments, the first conductive wirings 221 may include copper wirings, and can be formed by electroplating for example. In some embodiments, the first conductive wirings 221 formed by electroplating may cover the surface of the first patterned dielectric layer 241. The excessive first conductive wirings 221 may be removed, for example by etching such that the first conductive wirings 221 are substantially leveled with the surface of the first patterned dielectric layer 241. A second patterned dielectric layer 242 is formed on the first patterned dielectric layer 241 to partially expose the first conductive wirings 221. The material and formation of the second patterned dielectric layer 242 may be similar to that of the first patterned dielectric layer 241.

Figure 4C:
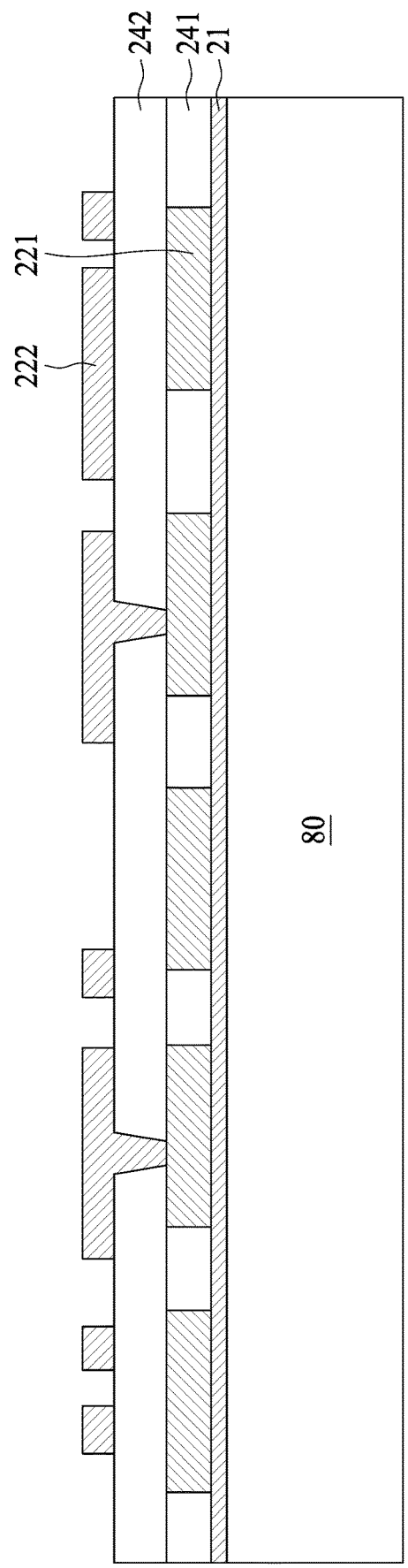

As shown in FIG. 4C, second conductive wirings 222 are formed on the second patterned dielectric layer 242 to electrically connecting the first conductive wirings 221 exposed by the second patterned dielectric layer 242. The material and formation of the second conductive wirings 222 may be similar to that of the first conductive wirings 221.

Figure 4D:
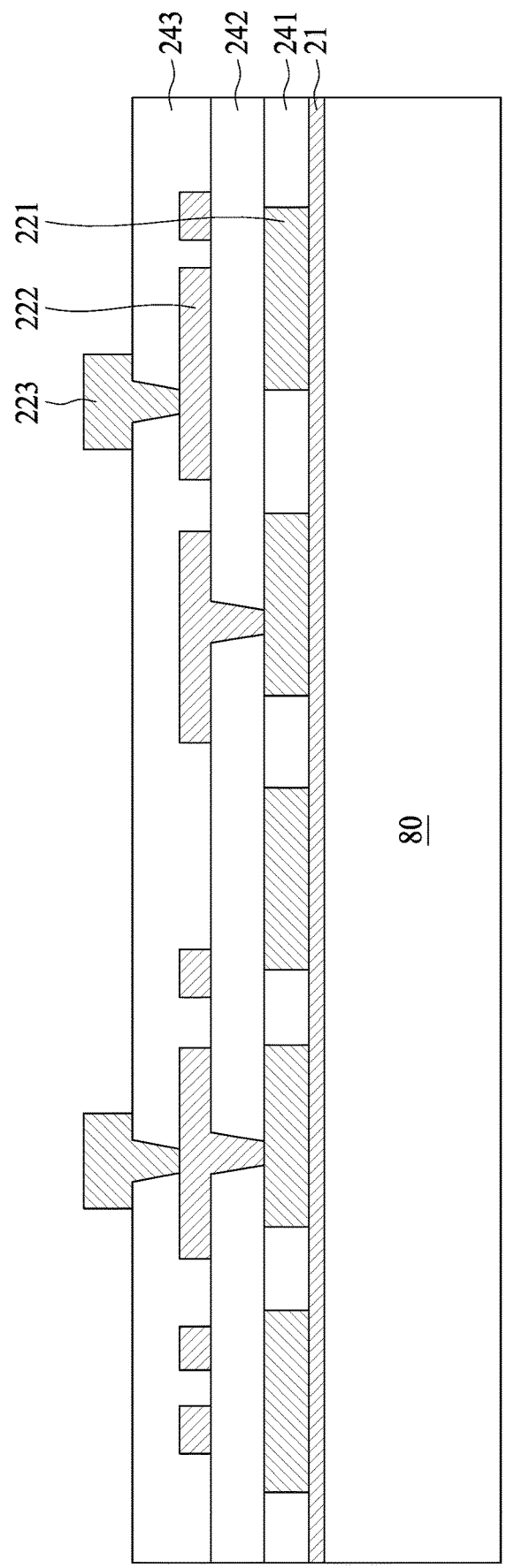

As shown in FIG. 4D, a third patterned dielectric layer 243 is formed on the second patterned dielectric layer 242 to partially expose the second conductive wirings 222 in a manner similar to the second patterned dielectric layer 242. Third conductive wirings 223 are formed on the third patterned dielectric layer 243 in a similar manner to the second conductive wirings 222 to electrically connecting the second conductive wirings 222 exposed by the third patterned dielectric layer 243. Accordingly, the first interconnection 20 as shown in FIG. 3A is formed. In some embodiments, the first patterned dielectric layer 241, the second patterned dielectric layer 242 and the third patterned dielectric layer 243 may be portions of the dielectric layer(s) 24 as shown in FIG. 3A. In some embodiments, the first conductive wirings 221, the second conductive wirings 222 and the third conductive wirings 223 may be portions of the conductive wirings 22 as shown in FIG. 3A. The layer numbers of the conductive wirings and patterned dielectric layers may be modified.

Figure 5A:
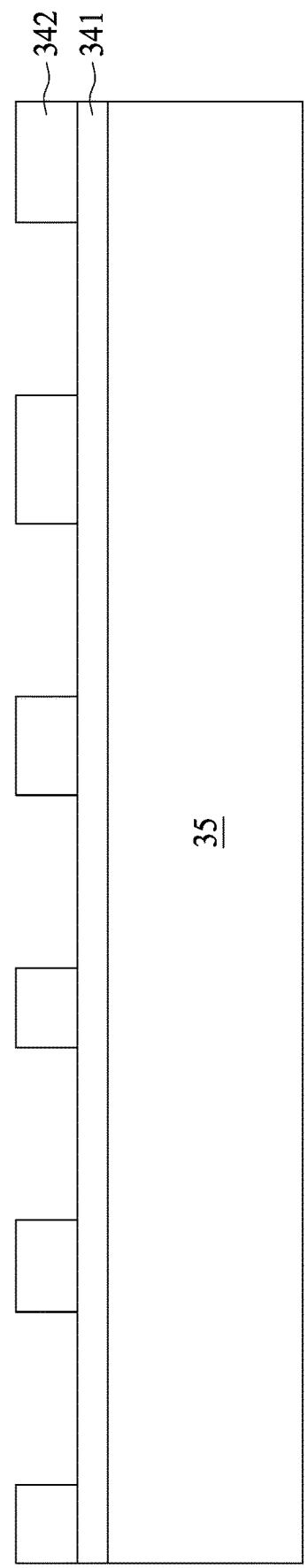
FIG. 5A, FIG. 5B, FIG. 5C and FIG. 5D illustrate operations of manufacturing a second interconnection structure of a semiconductor device package in accordance with some embodiments of the present disclosure.

FIG. 5A, FIG. 5B, FIG. 5C and FIG. 5D illustrate operations of manufacturing a second interconnection structure of a semiconductor device package in accordance with some embodiments of the present disclosure. As shown in FIG. 5A, a base 35 is received. A first dielectric layer 341 is formed on the base 35. A second patterned dielectric layer 342 is formed on the first dielectric layer 341 to partially expose the first dielectric layer 341. In some embodiments, the second patterned dielectric layer 342 may include a photo-resistive layer, which can be patterned by photolithography.

Figure 5B:
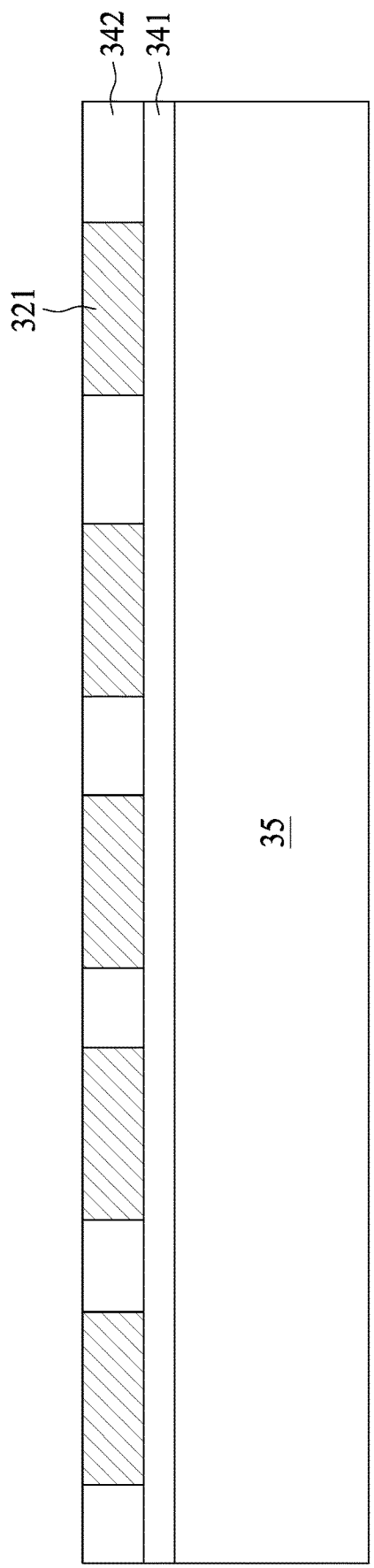

As shown in FIG. 5B, first conductive wirings 321 are formed on the first dielectric layer 341 exposed by the second patterned dielectric layer 342. In some embodiments, the first conductive wirings 321 may include copper wirings, and can be formed by electroplating for example.

Figure 5C:
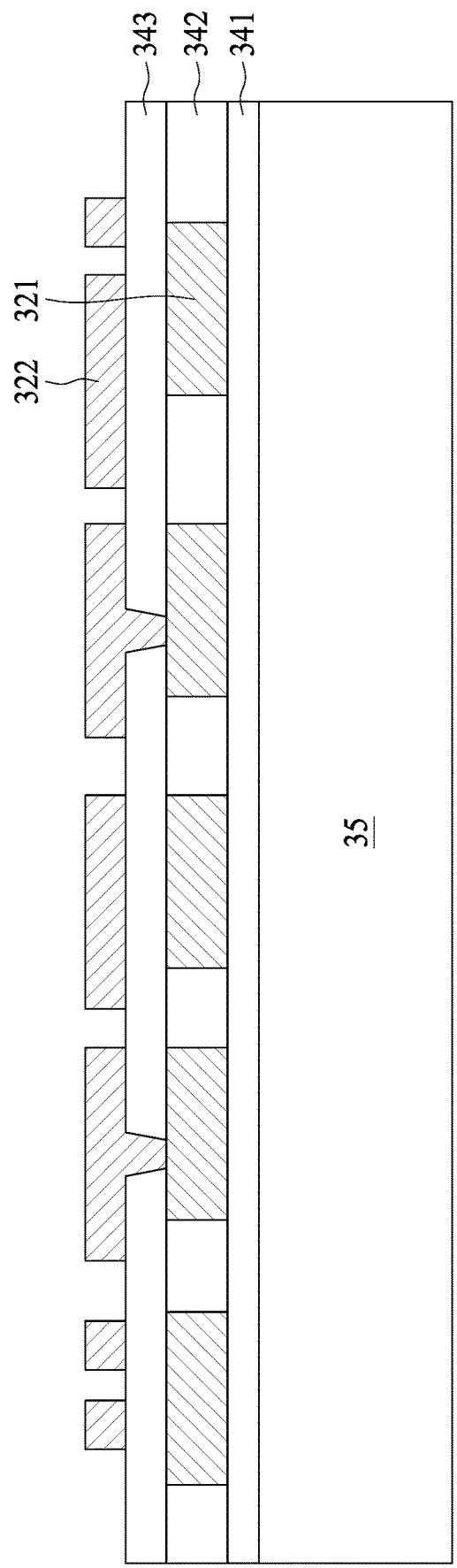

As shown in FIG. 5C, a third patterned dielectric layer 343 and second conductive wirings 322 are formed on the second patterned dielectric layer 342 in a similar manner to the second patterned dielectric layer 242 and the first conductive wirings 321.

Figure 5D:
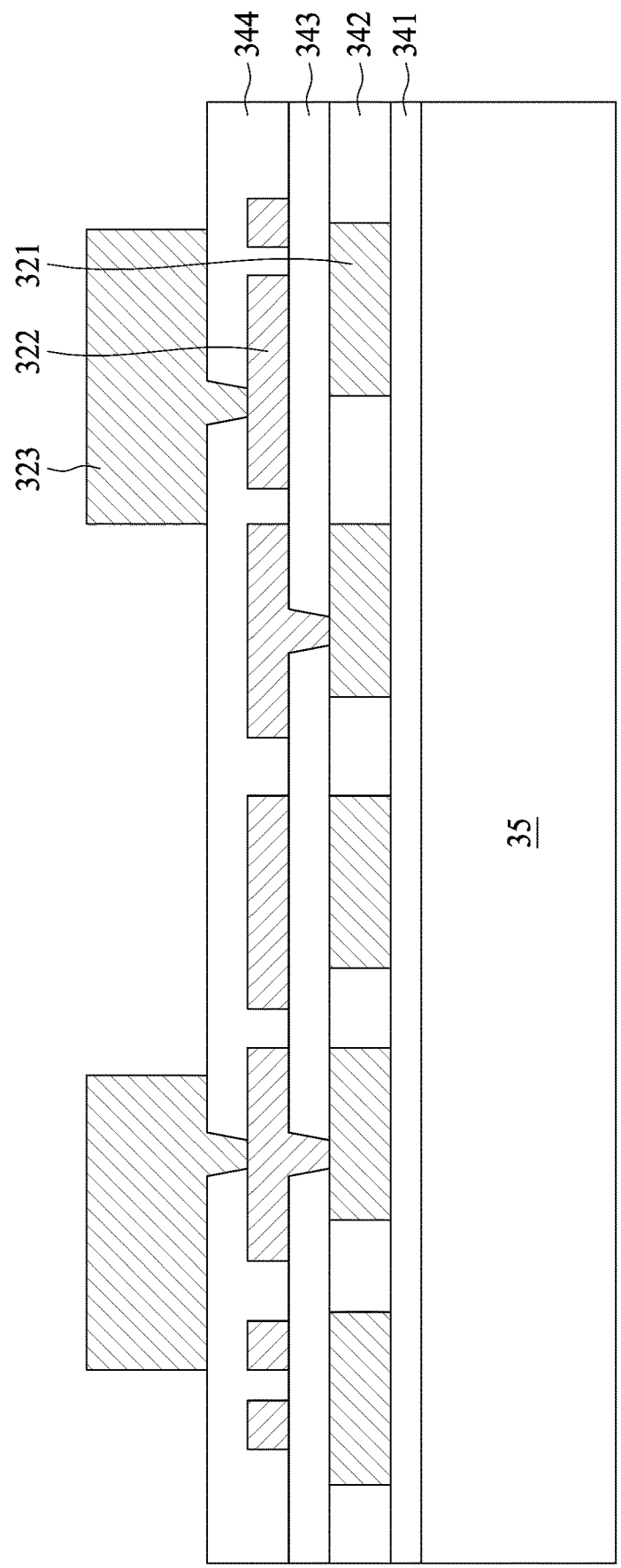

As shown in FIG. 5D, a fourth patterned dielectric layer 344 and third conductive wirings 323 are formed on the third patterned dielectric layer 343 in a similar manner to the second patterned dielectric layer 242 and the first conductive wirings 321. Accordingly, the second interconnection 20 as shown in FIG. 3B is formed. In some embodiments, the first dielectric layer 341, the second patterned dielectric layer 342, the third patterned dielectric layer 343 and the fourth patterned dielectric layer 344 may be portions of the dielectric layer(s) 34 as shown in FIG. 3B. In some embodiments, the first conductive wirings 321, the second conductive wirings 322 and the third conductive wirings 323 may be portions of the conductive wirings 32 as shown in FIG. 3B. The layer numbers of the conductive wirings and patterned dielectric layers may be modified.

Figure 6A:
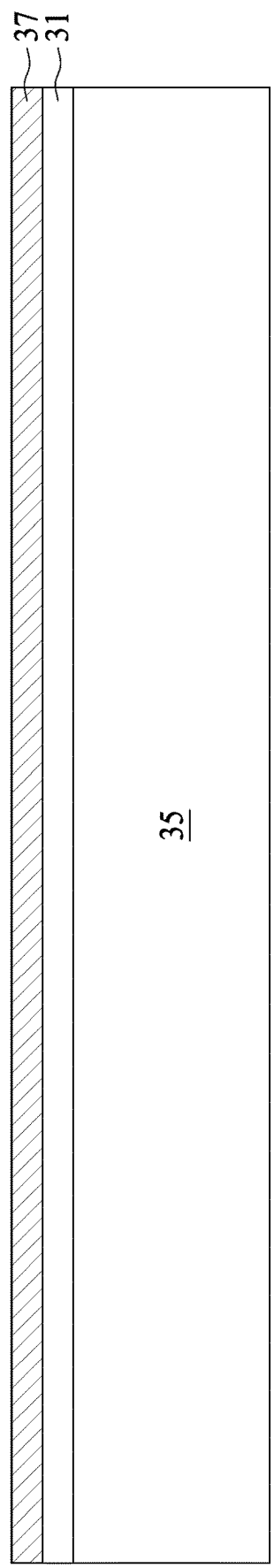
FIG. 6A, FIG. 6B, FIG. 6C and FIG. 6D illustrate operations of manufacturing a second interconnection structure of a semiconductor device package in accordance with some other embodiments of the present disclosure.

FIG. 6A, FIG. 6B, FIG. 6C and FIG. 6D illustrate operations of manufacturing a second interconnection structure of a semiconductor device package in accordance with some other embodiments of the present disclosure. As shown in FIG. 6A, a base 35 is received. A release layer 31 is formed on the base 35. A conductive layer 37 is formed on the release layer 31. In some embodiments, the conductive layer 37 may include a copper foil layer for example.

Figure 6B:
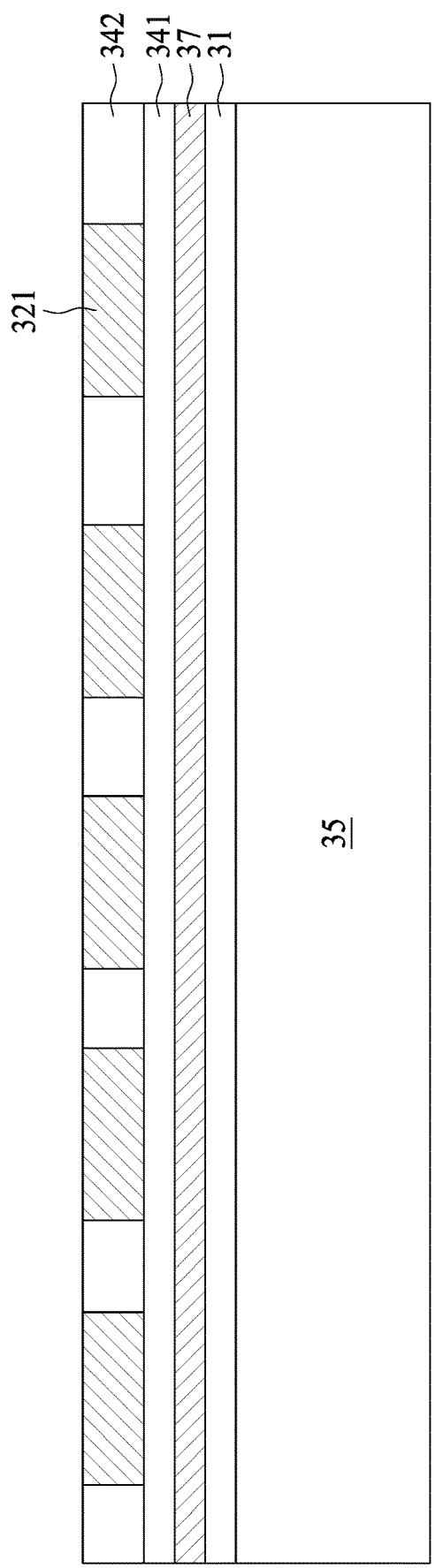

As shown in FIG. 6B, a first dielectric layer 341 is formed on the conductive layer 31. A second patterned dielectric layer 342 is formed on the first dielectric layer 341 to partially expose the first dielectric layer 341. First conductive wirings 321 are formed on the first dielectric layer 341 exposed by the second patterned dielectric layer 342.

Figure 6C:
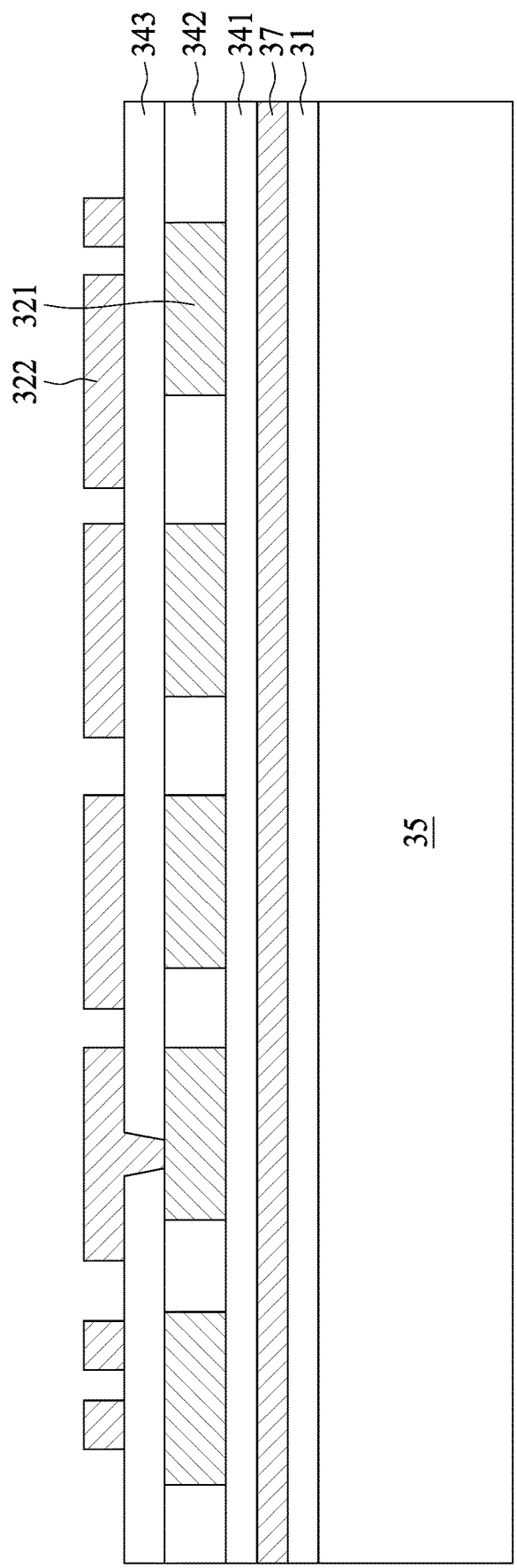
Figure 6D:
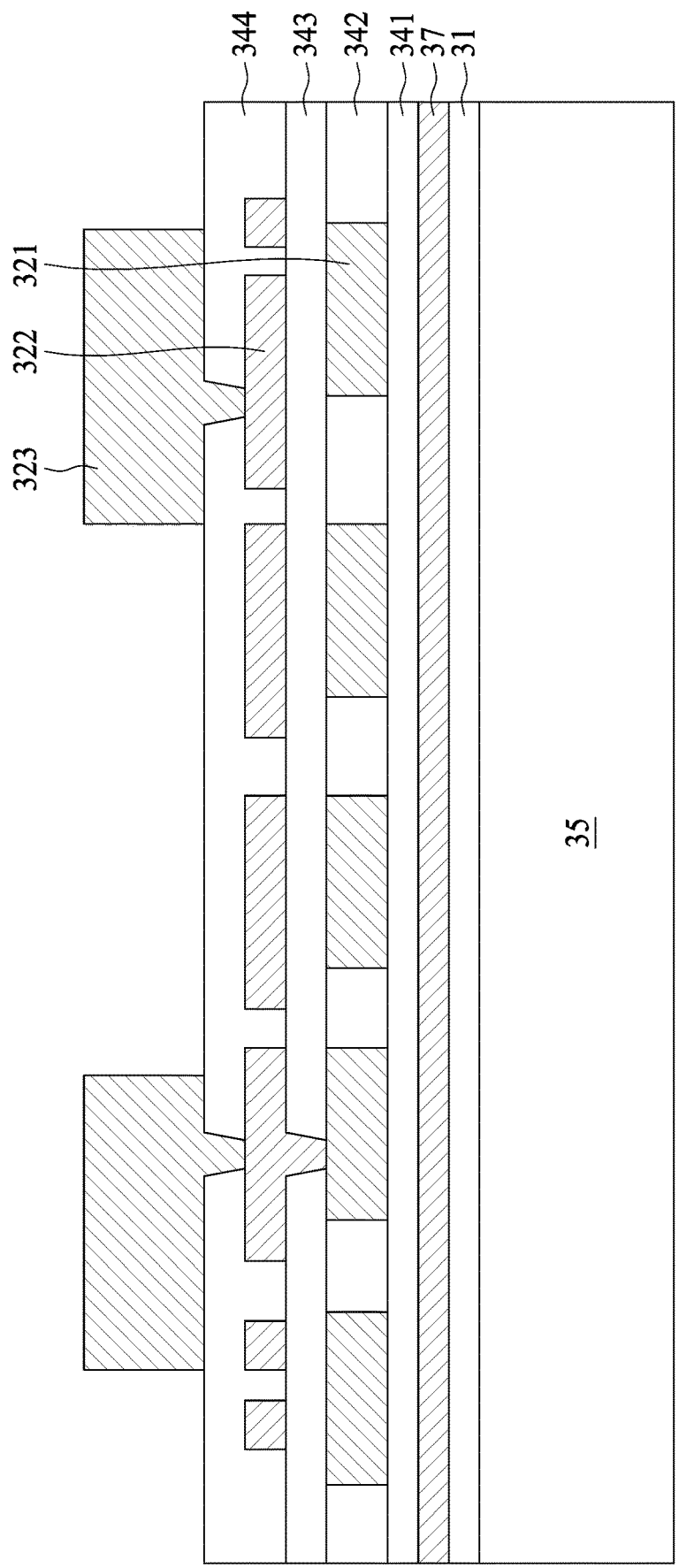

As shown in FIG. 6C, a third patterned dielectric layer 343 and second conductive wirings 322 are formed on the second patterned dielectric layer 342. As shown in FIG. 6D, a fourth patterned dielectric layer 344 and third conductive wirings 323 are formed on the third patterned dielectric layer 343. The base 35 and the release layer 31 may be released from the conductive layer 37 and the overlying dielectric layers and conductive wirings. The conductive layer 37 and the overlying dielectric layers and conductive wirings may be attached to the first interconnection structure 20 with an adhesive layer 36 as shown in FIG. 2.

Figure 7:
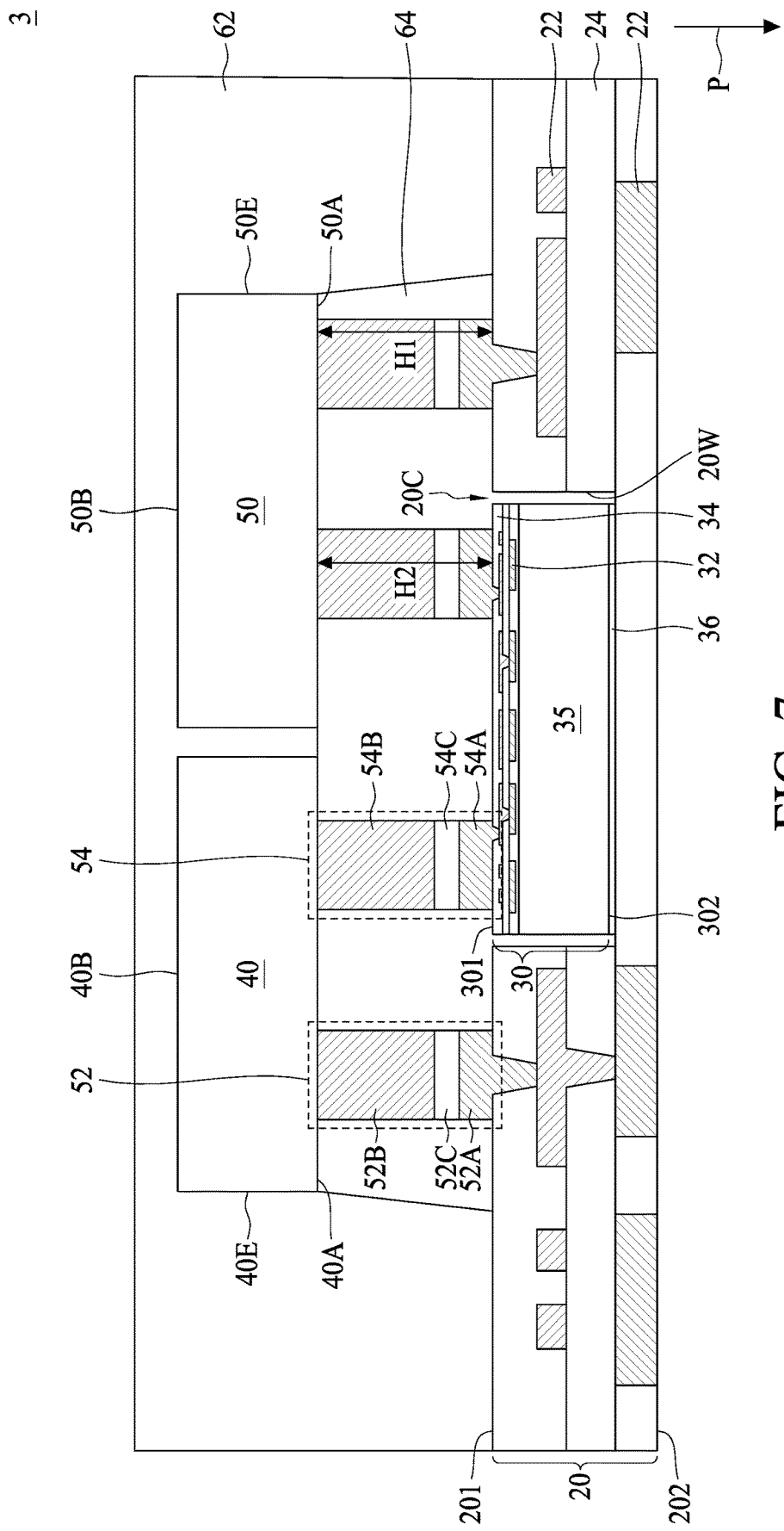
FIG. 7 is a cross-sectional view of a semiconductor device package in accordance with some embodiments of the present disclosure.

FIG. 7 is a cross-sectional view of a semiconductor device package 3 in accordance with some embodiments of the present disclosure. As shown in FIG. 7, in contrast to the semiconductor device package 1 and the semiconductor device package 2, the first interconnection structure 20 of the semiconductor device package 3 defines a cavity 20C recessed from the first surface 201, and the second interconnection structure is at least partially disposed in the cavity 20C of the first interconnection structure 20. The underfill layer 64 may be filled into the cavity 20C to cover the second interconnection structure 30. By virtue of the cavity 20C, the overall thickness of the semiconductor device package 3 may be reduced. In some embodiments, the cavity 20C does not penetrate through the first interconnection structure 20. For example, a portion of the dielectric layer 24 is remaining and configured as a mesa to dispose the second interconnection structure 30. The sidewall 20W of the cavity 20C may be substantially perpendicular to the first surface 201, or inclining with respect to the first surface 201. In some embodiments, the third surface 301 of the second interconnection structure is substantially leveled with the first surface 201 of the first interconnection structure 20, and the fourth surface 302 of the second interconnection structure 30 is between the first surface 201 and the second surface 202 of the first interconnection structure 20. In case the third surface 301 of the second interconnection structure is substantially leveled with the first surface 201 of the first interconnection structure 20, the height H1 of the first conductive structure 52 may be substantially equal to the height H2 of the second conductive structure 54. The first semiconductor die 40 and the second semiconductor die 50 can be disposed horizontally with respect to the first surface 201 of the first interconnection structure 20. In some other embodiments, the third surface 301 of the second interconnection structure may be higher than or lower than the first surface 201 of the first interconnection structure 20.

Figure 8:
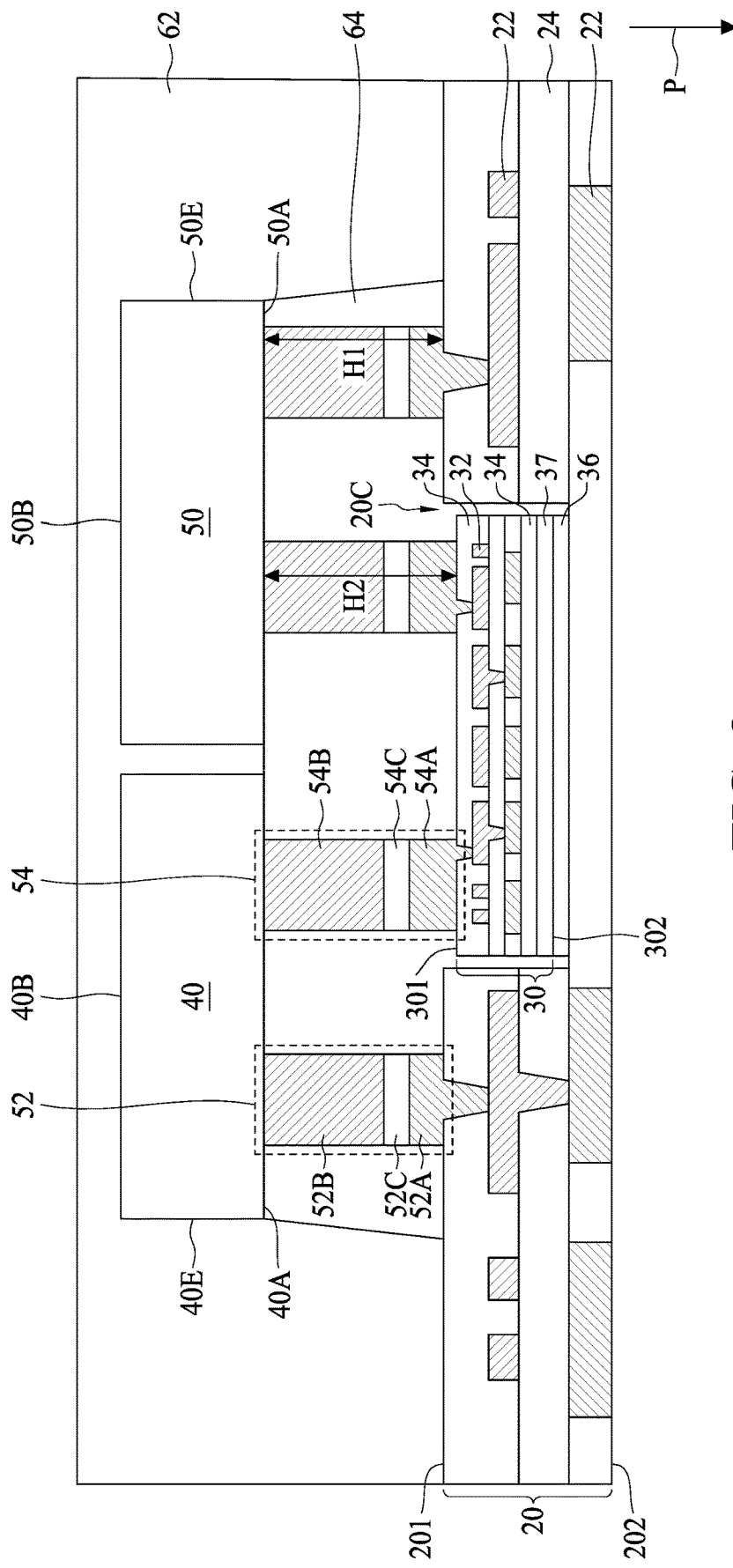
FIG. 8 is a cross-sectional view of a semiconductor device package in accordance with some embodiments of the present disclosure.

FIG. 8 is a cross-sectional view of a semiconductor device package 4 in accordance with some embodiments of the present disclosure. As shown in FIG. 8, in contrast to the semiconductor device package 3, a conductive layer 37 such as a copper foil layer is disposed between the first interconnection structure 20 and the second interconnection structure 30. In some embodiments, the base 35 may be omitted. The conductive layer 37 may be configured to support the second interconnection structure 30. The conductive layer 37 may also be configured as a heat dissipation layer.

Figure 9A:
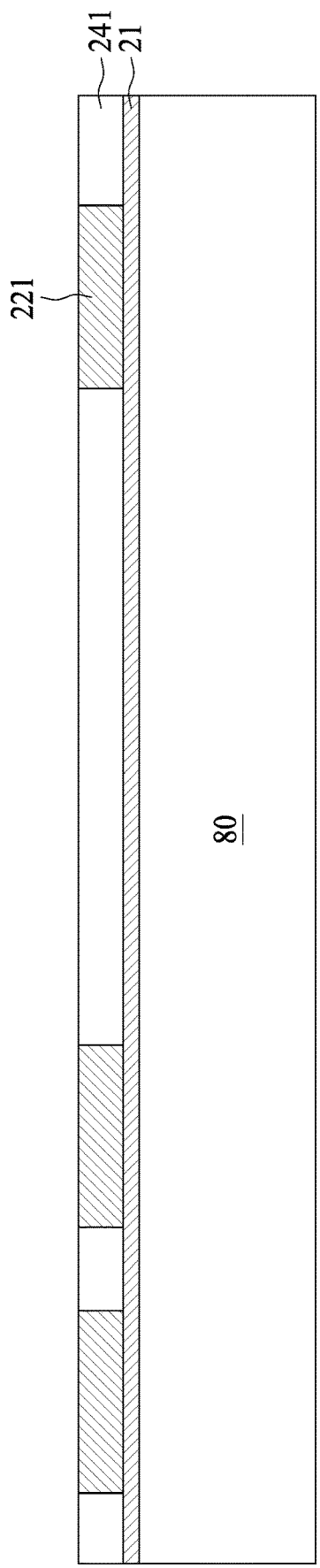
FIG. 9A, FIG. 9B, FIG. 9C and FIG. 9D illustrate operations of manufacturing a first interconnection structure of a semiconductor device package in accordance with some embodiments of the present disclosure.

FIG. 9A, FIG. 9B, FIG. 9C and FIG. 9D illustrate operations of manufacturing a first interconnection structure of a semiconductor device package in accordance with some embodiments of the present disclosure. As shown in FIG. 9A, a carrier 80 is received. A seed layer 21 is formed on the carrier 80. The seed layer 21 includes a conductive layer such as a copper layer, and the seed layer 21 can be formed by physical vapor deposition (PVD) such as sputtering. A first patterned dielectric layer 241 is formed on the seed layer 21 to partially expose the seed layer 21. First conductive wirings 221 are formed on the seed layer 21 exposed by the first patterned dielectric layer 241.

Figure 9B:
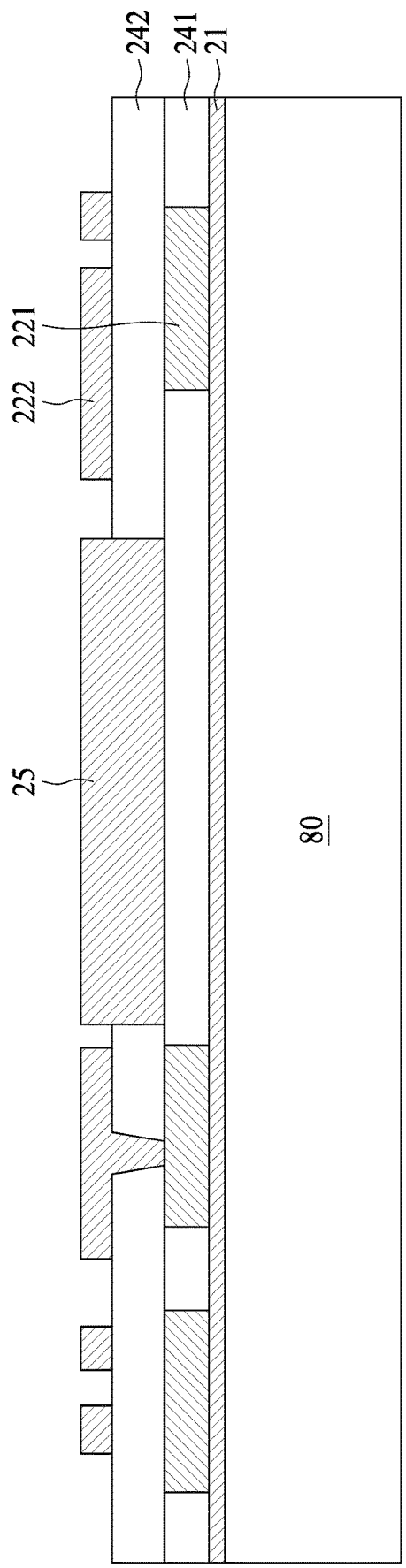

As shown in FIG. 9B, a second patterned dielectric layer 242 is formed on the first patterned dielectric layer 241 to partially expose the first conductive wirings 221. Second conductive wirings 222 are formed on the second patterned dielectric layer 242 to electrically connecting the first conductive wirings 221 exposed by the second patterned dielectric layer 242. A sacrificial conductive pattern 25 may be at least partially embedded in the second patterned dielectric layer 242. In some embodiments, the sacrificial conductive pattern 25 may be formed along with the second conductive wirings 222. For example, the sacrificial conductive pattern 25 may be a portion of the second conductive wirings 222 and may be formed concurrently with the second conductive wirings 222.

Figure 9C:
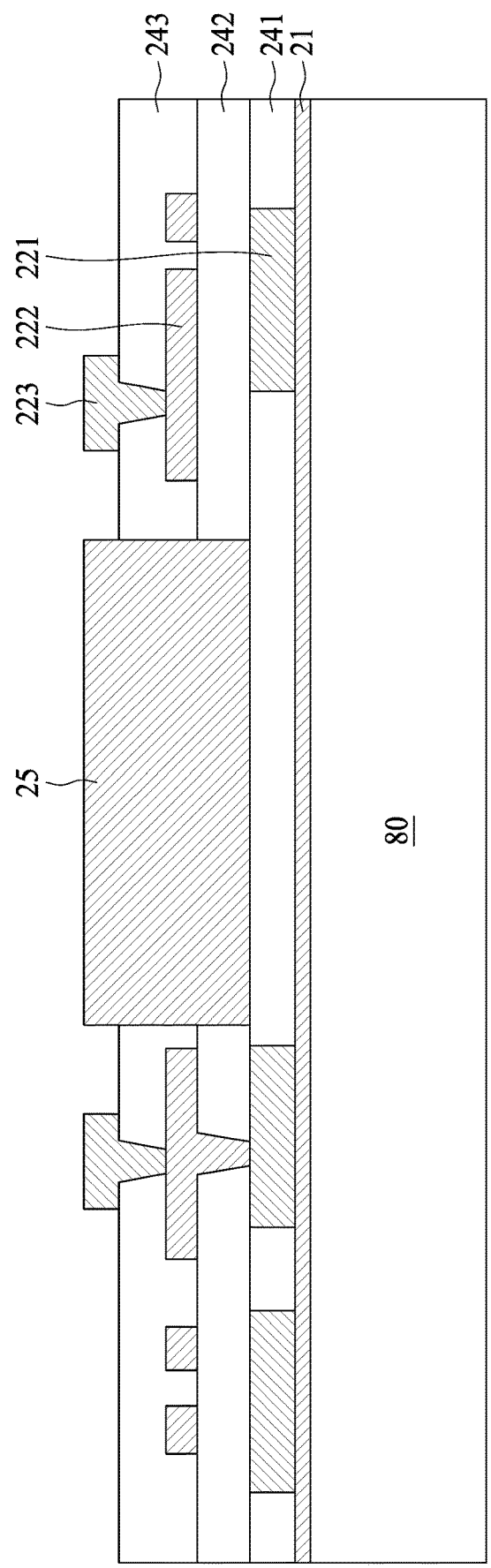

As shown in FIG. 9C, a third patterned dielectric layer 243 is formed on the second patterned dielectric layer 242 to partially expose the second conductive wirings 222 and to expose the sacrificial conductive pattern 25. Third conductive wirings 223 are formed on the third patterned dielectric layer 243 to electrically connecting the second conductive wirings 222 exposed by the third patterned dielectric layer 243. In some embodiments, the sacrificial conductive pattern 25 can be further formed along with the third conductive wirings 223. For example, a portion of the sacrificial conductive pattern 25 may be a portion of the third conductive wirings 223 and may be formed concurrently with the third conductive wirings 223.

Figure 9D:
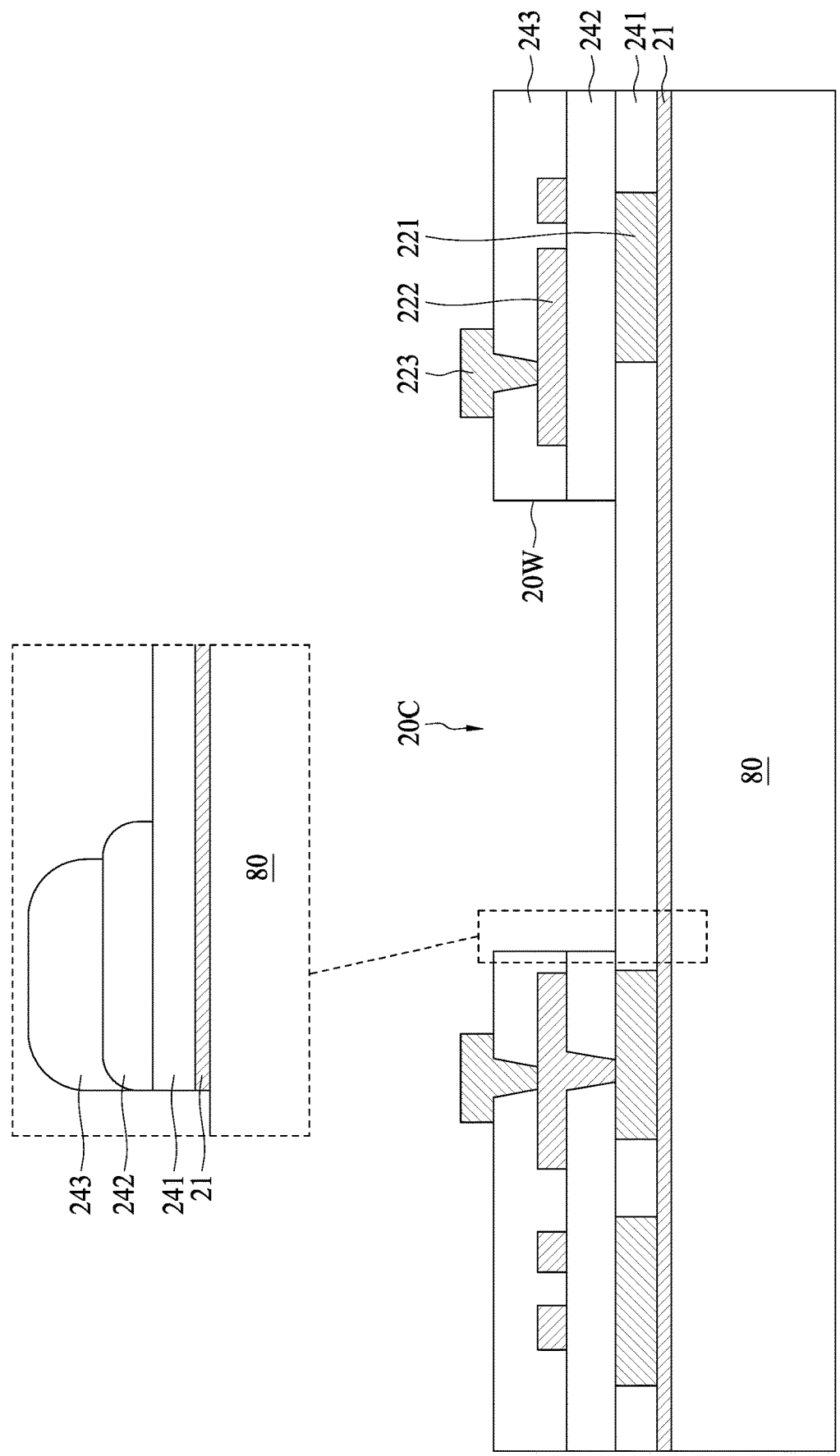

As shown in FIG. 9D, the sacrificial conductive layer 25 is removed to form the cavity 20C in the first interconnection structure 20. In some embodiments, the sidewall 20W of the cavity 20C may be inclining with respect to the first surface 201 as shown in the enlarged view of FIG. 9D. In some embodiments, the sacrificial conductive layer 25 may, but is not limited to be, formed by etching. The sidewall 20W of the cavity 20C may include a step shape, which may be formed due to different etching rates of the second patterned dielectric layer 242 and the third patterned dielectric layer 243.

Figure 10:
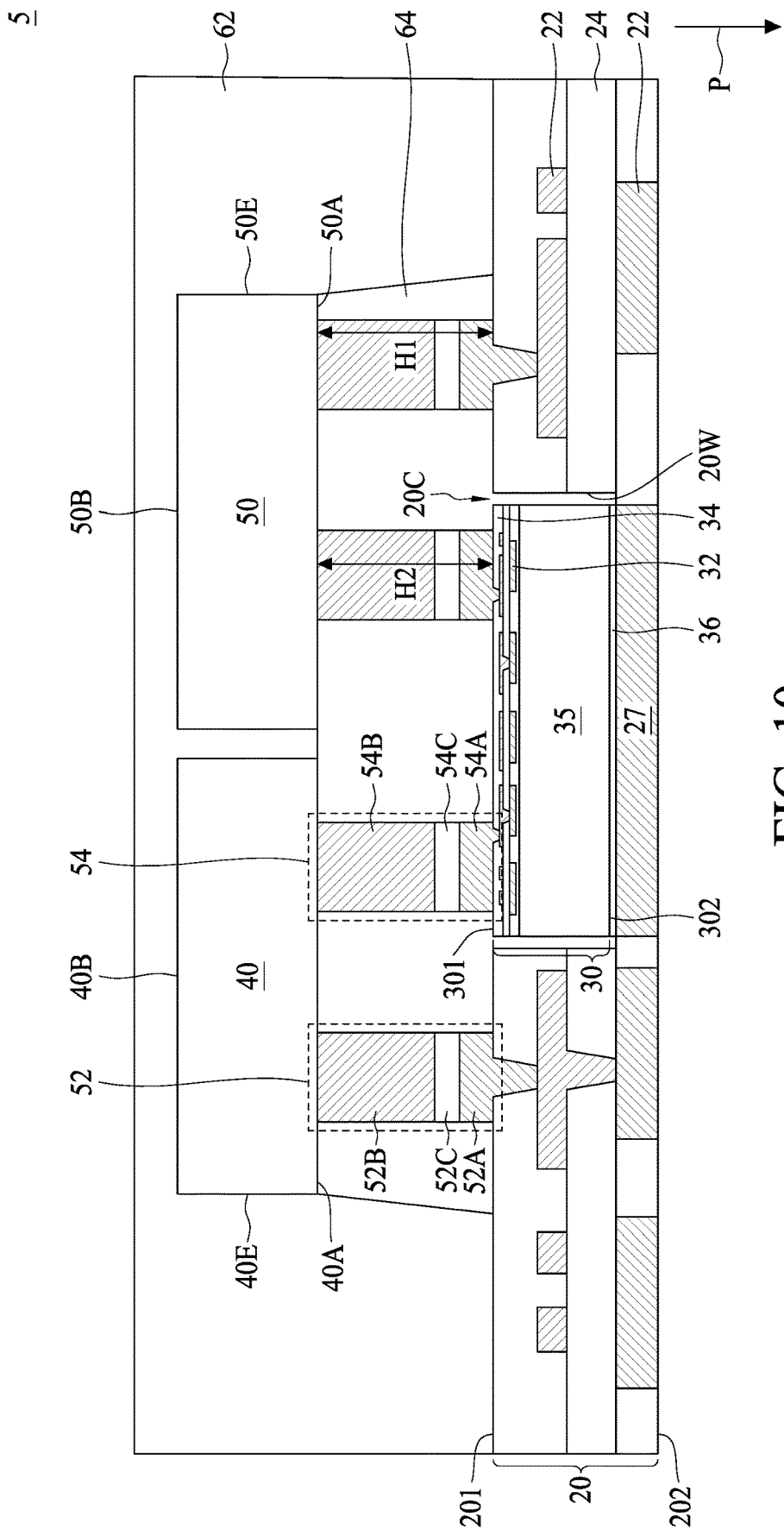
FIG. 10 is a cross-sectional view of a semiconductor device package in accordance with some embodiments of the present disclosure.

FIG. 10 is a cross-sectional view of a semiconductor device package 5 in accordance with some embodiments of the present disclosure. As shown in FIG. 10, in contrast to the semiconductor device package 3, the semiconductor device package 5 may further include a conductive layer 27 at least partially embedded in the first interconnection structure 20. The conductive layer 27 may be configured as a mesa to dispose the second interconnection structure 30. The second interconnection structure 30 may be attached to the conductive layer 27 by an adhesive layer 36, and electrically isolated from the conductive layer 27 by the adhesive layer 27. The conductive layer 27 may be electrically connected to the first conductive wirings 22 or electrically disconnected from the first conductive wirings 22. The conductive layer 37 may be configured as a heat dissipation layer.

Figure 11A:
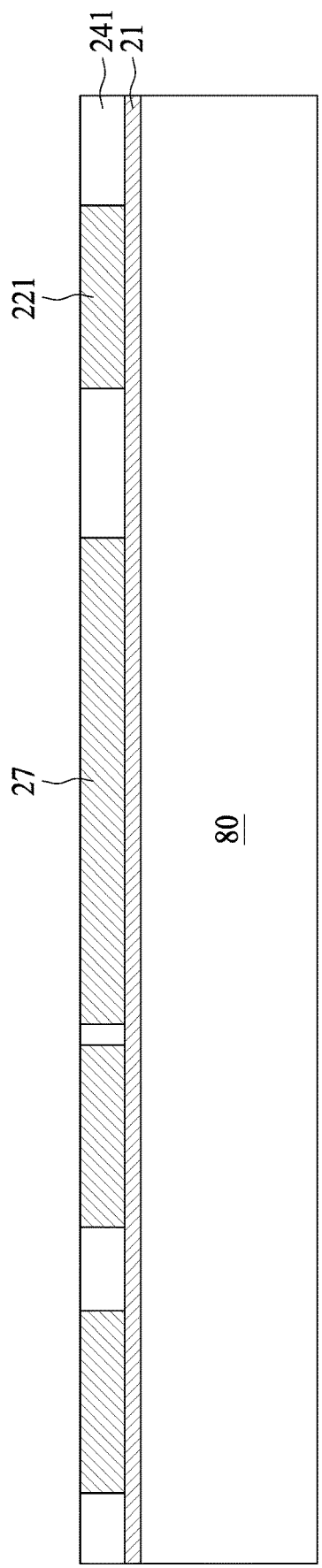
FIG. 11A, FIG. 11B, FIG. 11C and FIG. 11D illustrate operations of manufacturing a first interconnection structure of a semiconductor device package in accordance with some embodiments of the present disclosure.

FIG. 11A, FIG. 11B, FIG. 11C and FIG. 11D illustrate operations of manufacturing a first interconnection structure of a semiconductor device package in accordance with some embodiments of the present disclosure. As shown in FIG. 11A, a carrier 80 is received. A seed layer 21 is formed on the carrier 80. A first patterned dielectric layer 241 is formed on the seed layer 21 to partially expose the seed layer 21. First conductive wirings 221 are formed on the seed layer 21 exposed by the first patterned dielectric layer 241. A conductive layer 27 is formed on the seed layer 21 exposed by the first patterned dielectric layer 241. In some embodiments, the conductive layer 27 may be formed concurrently with the first conductive wirings 221. The conductive layer 27 can be electrically connected to the first conductive wirings 221, or electrically disconnected from the first conductive wirings 221.

Figure 11B:
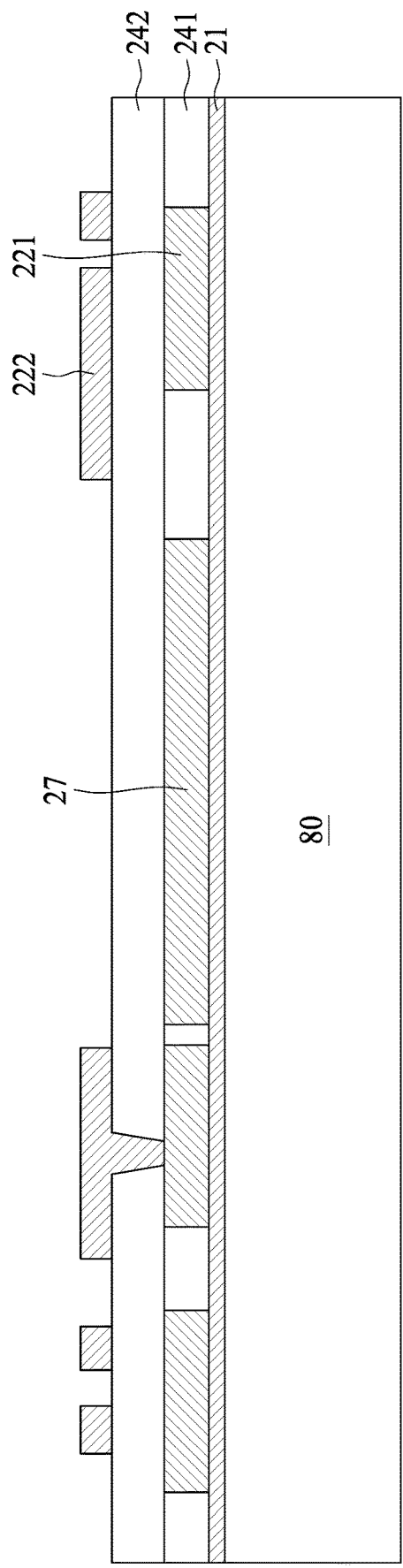

As shown in FIG. 11B, a second patterned dielectric layer 242 is formed on the first patterned dielectric layer 241 to partially expose the first conductive wirings 221, and to cover the conductive layer 27. Second conductive wirings 222 are formed on the second patterned dielectric layer 242 to electrically connecting the first conductive wirings 221 exposed by the second patterned dielectric layer 242.

Figure 11C:
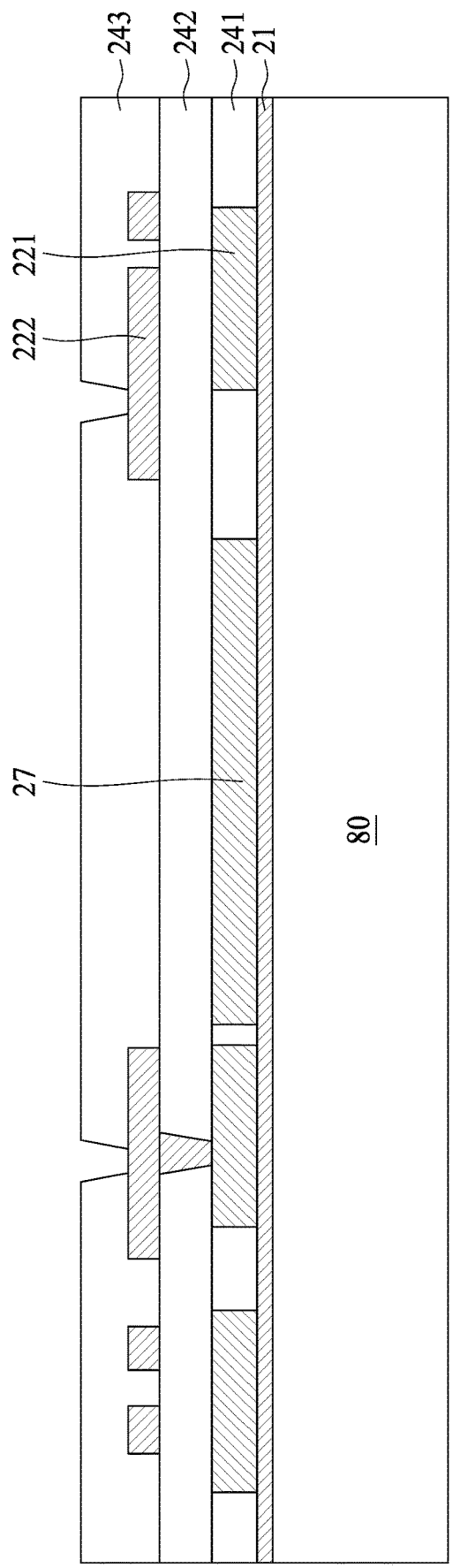
Figure 11D:
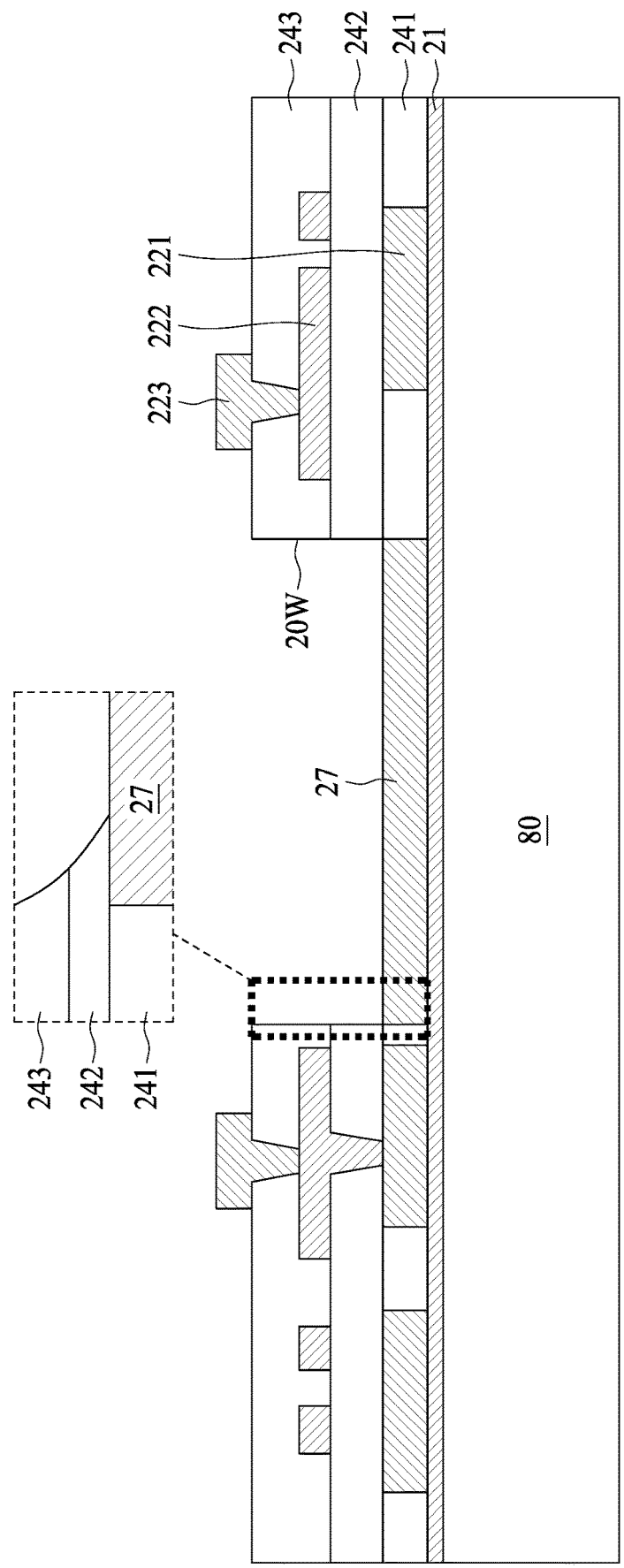

As shown in FIG. 11C, a third patterned dielectric layer 243 is formed on the second patterned dielectric layer 242 to partially expose the second conductive wirings 222. As shown in FIG. 11D, third conductive wirings 223 are formed on the third patterned dielectric layer 243 to electrically connecting the second conductive wirings 222 exposed by the third patterned dielectric layer 243. The third patterned dielectric layer 243 and the second patterned dielectric layer 242 are partially removed to form the cavity 20C. In some embodiments, the third patterned dielectric layer 243 and the second patterned dielectric layer 242 are removed by laser ablation, and the conductive layer 27 may be configured as a stop pattern for laser ablation. As shown in the enlarged view of FIG. 11D, the sidewall 20W of the cavity 20C may be inclining, and the second patterned dielectric layer 242 and the third patterned dielectric layer 243 may partially cover the conductive layer 27 after the laser ablation.

In some embodiments of the present disclosure, a semiconductor device package uses interconnection structures with different I/O terminal densities to diverge low-density I/O connections and high-density I/O connections between two or more semiconductor dies. The density of I/O terminals of the high-density interconnection structure is relatively higher than that of the low-density interconnection structure.

The low-density interconnection structure and the high-density interconnection structure are individually formed by different processes, and thus can be respectively used to provide interconnections for low-density I/O region and high-density I/O region of the semiconductor dies. Compared to an interconnection structure including multi-layered circuit layers for providing interconnection for both low-density I/O region and high-density I/O region of the semiconductor dies, the individual high-density and low-density interconnection structures diverge the interconnections for low-density I/O region and high-density I/O region of the semiconductor dies. Accordingly, the layer(s) of the circuit layer of each of the high-density interconnection structure and the low-density interconnection structure can be reduced, and thus yield of each of the high-density interconnection structure and the low-density interconnection structure can be increased. In addition, the individual high-density and low-density interconnection structures can shorten the signal transmission path between the semiconductor dies, and thus electrical performance of the semiconductor device package can be improved. The high-density interconnection structure can be partially embedded in the low-density interconnection structure, and the overall thickness of the semiconductor device package can be further reduced.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
a first redistribution layer (RDL) including a top surface;
a second RDL including a top surface, a bottom surface opposite to the top surface, a conductive wiring and a metal layer, wherein the conductive wiring is closer to the top surface than the bottom surface is, and the metal layer is closer to the bottom surface than the top surface is;
a first semiconductor component disposed over the top surface of the first RDL and over the top surface of the second RDL;
a second semiconductor component disposed over the top surface of the first RDL and over the top surface of the second RDL, and electrically connected to the first semiconductor component through the conductive wiring of the second RDL, wherein in a cross-sectional view, a lateral surface of the metal layer is substantially aligned with a lateral surface of the second RDL; and
an encapsulant contacting the lateral surface of the metal layer and an inner sidewall of the first RDL,
wherein the top surface of the second RDL is lower than the top surface of the first RDL, and wherein the first RDL further includes a first inner via tapering toward the bottom surface of the first RDL.

2. The semiconductor device package of claim 1, wherein the encapsulant further contacts the first semiconductor component and the second semiconductor component, and in the cross-sectional view, a top surface of the encapsulant is substantially aligned with a bottom surface of the first semiconductor component and a bottom surface of the second semiconductor component.

3. The semiconductor device package of claim 1, wherein a width of the second RDL is less than a width of the first RDL, the second RDL further includes a second inner via tapering toward the bottom surface of the second RDL.

4. The semiconductor device package of claim 3, further comprising a pillar disposed over the top surface of the second RDL and a solder material disposed on the pillar; wherein in a cross-sectional view, the pillar is electrically connected to the conductive wiring through the second inner via, and the pillar extends beyond a level of the top surface of the first RDL.

5. The semiconductor device package of claim 4, wherein a thickness of the solder material is less than a thickness of the pillar.

6. The semiconductor device package of claim 4, wherein the pillar includes an upper portion above the level of the top surface of the first RDL and a lower portion under the level of the top surface of the first RDL, and a thickness of the upper portion is greater than a thickness of the lower portion.

7. The semiconductor device package of claim 1, wherein the metal layer is configured for heat dissipation.

8. The semiconductor device package of claim 7, wherein in the cross-sectional view, the metal layer is spaced apart from the conductive wiring.

9. A semiconductor device package, comprising:
  a first redistribution layer (RDL) having a top surface, defining a recess recessed from the top surface, and including:
    a first dielectric layer having a first inner side surface; and
    a second dielectric layer disposed over the first dielectric layer, and having a second inner side surface; wherein both the first inner side surface and the second inner side surface partially define the recess; wherein in a cross-sectional view, both the first inner side surface and the second inner side surface include curved surfaces.

10. The semiconductor device package of claim 9, wherein a thickness of the second dielectric layer is greater than a thickness of the first dielectric layer.

11. The semiconductor device package of claim 9, wherein the first dielectric layer further has a first outer side surface opposite to the first inner side surface, the second dielectric layer further has a second outer side surface opposite to the second inner side surface, and both the first outer side surface and the second outer side surface include curved surfaces.

12. The semiconductor device package of claim 9, wherein the first dielectric layer further has a first outer side surface opposite to the first inner side surface, wherein the first dielectric layer further has a top surface and defines an indentation portion recessed from the top surface and connected to the first outer side surface, wherein a portion of the second dielectric layer extends into the indentation portion.

13. The semiconductor device package of claim 9, wherein a thickness of the second dielectric layer is greater than a thickness of the first dielectric layer, wherein the first dielectric layer further has a first outer side surface opposite to the first inner side surface, the second dielectric layer further has a second outer side surface opposite to the second inner side surface, and both the first outer side surface and the second outer side surface include curved surfaces, wherein the first dielectric layer further has a top surface and defines an indentation portion recessed from the top surface and connected to the first outer side surface, wherein a portion of the second dielectric layer extends into the indentation portion.

* * * * *